(12) United States Patent
Kong et al.

(10) Patent No.: US 12,382,798 B2
(45) Date of Patent: Aug. 5, 2025

(54) DISPLAY SUBSTRATE, PREPARATION METHOD THEREFOR, AND DISPLAY DEVICE FOR AVOIDING CROSSTALK DEFECT

(71) Applicants: Chengdu BOE Optoelectronics Technology Co., Ltd., Sichuan (CN); BOE Technology Group Co., Ltd., Beijing (CN)

(72) Inventors: Chao Kong, Beijing (CN); Yifan Yang, Beijing (CN); Wei Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 149 days.

(21) Appl. No.: 17/768,841

(22) PCT Filed: Jul. 5, 2021

(86) PCT No.: PCT/CN2021/104525
§ 371 (c)(1),
(2) Date: Apr. 13, 2022

(87) PCT Pub. No.: WO2022/042046
PCT Pub. Date: Mar. 3, 2022

(65) Prior Publication Data
US 2024/0138210 A1 Apr. 25, 2024
US 2024/0237432 A9 Jul. 11, 2024

(30) Foreign Application Priority Data

Aug. 28, 2020 (CN) .......................... 202010892357.0

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/122* (2023.02); *H10K 59/353* (2023.02)

(58) Field of Classification Search
CPC ............. H10K 59/131; H10K 59/1201; H10K 59/122; H10K 59/353; H10K 71/00
See application file for complete search history.

(56) References Cited

U.S. PATENT DOCUMENTS

2008/0284323 A1* 11/2008 Kashiwabara ....... H10K 50/805
   313/504
2010/0051958 A1* 3/2010 Izumida ........... H10K 59/80522
   257/E33.053
(Continued)

FOREIGN PATENT DOCUMENTS

CN 101308865 A 11/2008
CN 102623485 A 8/2012
(Continued)

OTHER PUBLICATIONS

International Search Report for PCT/CN2021/104525 Mailed Sep. 23, 2021.
(Continued)

*Primary Examiner* — Caleb E Henry
(74) *Attorney, Agent, or Firm* — Ling Wu; Stephen Yang; Ling and Yang Intellectual Property

(57) ABSTRACT

A display substrate, including: a base substrate. The base substrate includes a display region, and the display region is provided with a plurality of sub-pixels and a conductive protective structure. At least one sub-pixel among the plurality of sub-pixels includes: a light-emitting element and a driving circuit that drives the light-emitting element to emit light. The light-emitting elements and the conductive protective structure are located on the side of the driving circuit away from the base substrate. The conductive protective (Continued)

structure includes at least one conductive part, and the at least one conductive part is located at an interval between respective light-emitting parts of light-emitting elements of at least two adjacent sub-pixels. The conductive protective structure is electrically connected to a signal terminal, and is configured to reduce carrier transmission between adjacent sub-pixels.

20 Claims, 11 Drawing Sheets

(51) Int. Cl.
*H10K 59/122* (2023.01)
*H10K 59/35* (2023.01)

(56) References Cited

U.S. PATENT DOCUMENTS

| | | | |
|---|---|---|---|
| 2012/0187425 | A1 | 7/2012 | Omoto |
| 2014/0225140 | A1 | 8/2014 | Nishido et al. |
| 2017/0186971 | A1* | 6/2017 | Kanamoto ............. H10K 77/00 |
| 2017/0324054 | A1* | 11/2017 | Ishisone ............. H10K 59/1213 |
| 2018/0088260 | A1 | 3/2018 | Jin et al. |
| 2018/0180951 | A1* | 6/2018 | Toyotaka ............. H10K 59/122 |
| 2019/0363276 | A1* | 11/2019 | Li ........................ H10K 59/35 |
| 2020/0083489 | A1* | 3/2020 | Fang .................... H10K 59/122 |
| 2021/0098501 | A1* | 4/2021 | Liu ...................... H10D 86/411 |
| 2021/0210561 | A1* | 7/2021 | Wang .................. H10K 59/123 |
| 2021/0336180 | A1 | 10/2021 | Huang |
| 2021/0351248 | A1* | 11/2021 | Lee ................... H10K 59/1216 |

FOREIGN PATENT DOCUMENTS

| | | |
|---|---|---|
| CN | 107293572 A | 10/2017 |
| CN | 109599426 A | 4/2019 |
| CN | 110634922 A | 12/2019 |
| CN | 111430438 A | 7/2020 |
| CN | 111446280 A | 7/2020 |
| CN | 111863929 A | 10/2020 |
| WO | 2017140038 A1 | 8/2017 |

OTHER PUBLICATIONS

Office Action dated Jul. 28, 2022 for Chinese Patent Application No. 202010892357.0 and English Translation.
Office Action dated Jan. 19, 2023 for Chinese Patent Application No. 202010892357.0 and English Translation.

* cited by examiner

DISPLAY SUBSTRATE, PREPARATION METHOD THEREFOR, AND DISPLAY DEVICE FOR AVOIDING CROSSTALK DEFECT

CROSS-REFERENCE TO RELATED APPLICATIONS

The present application is a U.S. National Phase Entry of International Application No. PCT/CN2021/104525 having an international filing date of Jul. 5, 2021, which claims priority to Chinese Patent Application No. 202010892357.0 entitled "Display Substrate, Preparation Method Therefor, and Display Device" and filed on Aug. 28, 2020. The above-identified applications are hereby incorporated by reference.

TECHNICAL FIELD

The present disclosure relates to, but is not limited to, the field of display technologies, in particular to a display substrate and a preparation method thereof, and a display apparatus.

BACKGROUND

An Organic light-emitting Diode (OLED) is an active display apparatus and has advantages such as self-luminescence, wide view, high contrast, low power consumption, extremely high response speed, etc. With the continuous development of display technology, a display apparatus using an OLED as a light-emitting device and a Thin Film Transistor (TFT) for signal control has become a mainstream product in the field of display at present.

SUMMARY

The following is a summary of subject matters described herein in detail. The summary is not intended to limit the scope of protection of claims.

The present disclosure provides a display substrate and a preparation method thereof, and a display apparatus.

In one aspect, the present disclosure provides a display substrate, including a substrate. The substrate includes a display region, which is provided with a plurality of sub-pixels and a conductive protection structure. At least one of the plurality of sub-pixels includes a light-emitting element and a drive circuit for driving the light-emitting element to emit light. The light-emitting element and a conductive protection structure are located on a side of the drive circuit away from the substrate. The conductive protection structure includes at least one conductive part located at an interval between light-emitting parts of light-emitting elements of at least two adjacent sub-pixels. The conductive protection structure is electrically connected with a signal terminal and configured to reduce carrier transmission between adjacent sub-pixels.

In some exemplary embodiments, the at least one conductive part is located at an interval between light-emitting parts of light-emitting elements of at least two adjacent sub-pixels of different colors.

In some exemplary embodiments, the light-emitting element includes an organic function layer including at least two organic layers, and the at least one conductive part is in contact with at least one of the organic layers.

In some exemplary embodiments, the at least two organic layers include a first layer, wherein a projection of the first layer on the substrate is at least overlapped with the projection of the light-emitting parts of the light-emitting elements of the two sub-pixels on the substrate, and the first layer is in contact with the at least one conductive part.

In some exemplary embodiments, the first layer is a common layer between light-emitting elements of a plurality of sub-pixels.

In some exemplary embodiments, the resistivity of the at least one conductive part is less than the resistivity of the organic layer contacting the at least one conductive part.

In some exemplary embodiments, the display region is further provided with a pixel define layer located on a side of the drive circuit away from the substrate. The pixel define layer includes a plurality of sub-pixel definition parts; wherein a pixel define layer opening is formed between adjacent sub-pixel definition parts, and the part of the light-emitting element located in the pixel define layer opening is used for light emission. The conductive protection structure is provided on a side of the sub-pixel definition part away from the substrate, and a projection of the sub-pixel definition part on the substrate covers a projection of the conductive protection structure on the substrate.

In some exemplary embodiments, the light-emitting element further includes a first electrode and a second electrode. The first electrode is disposed on a side of the drive circuit away from the substrate and electrically connected with the drive circuit, and a pixel define layer opening of the pixel define layer exposes at least part of the first electrode. The organic function layer is disposed on a side of the first electrode away from the substrate, and is in contact with the first electrode through the pixel define layer opening. The second electrode is disposed on a side of the organic function layer away from the substrate, and is in contact with the organic function layer.

In some exemplary embodiments, the organic function layer includes an emitting layer and at least one of a hole injection layer, a hole transport layer, an electron block layer, an electron injection layer, an electron transport layer, and a hole block layer.

In some exemplary embodiments, the projection of the at least one conductive part on the substrate overlaps the projection of emitting layers of two sub-pixels on the substrate and is not overlapped with the projection of the pixel define layer opening on the substrate.

In some exemplary embodiments, the emitting layers of the two sub-pixels are overlapped, and the projection of the at least one conductive part on the substrate is overlapped with the projection of the overlapping part of the emitting layers of the two sub-pixels on the substrate.

In some exemplary embodiments, at least one of the hole injection layer, the hole transport layer, the electron block layer, the electron injection layer, the electron transport layer, and the hole block layer is a common layer between light-emitting elements of a plurality of sub-pixels.

In some exemplary embodiments, the conductive protection structure is electrically connected to the signal terminal through the second electrode.

In some exemplary embodiments, the voltage value of the signal terminal is between a minimum voltage value of the second electrode and a maximum voltage value of the first electrode of the light-emitting element.

In some exemplary embodiments, the conductive protection structure is a mesh structure formed by the at least one conductive part, and the mesh structure includes at least one mesh that surrounds a light-emitting part of a light-emitting element of a sub-pixel or surrounds a light-emitting part of a light-emitting element of a plurality of adjacent sub-pixels of the same color.

In some exemplary embodiments, a plurality of sub-pixels in the display region are arranged according to a repeating unit including two first color sub-pixels, one second color sub-pixel and one third color sub-pixel in a first direction, wherein the two first color sub-pixels are arranged in a second direction perpendicular to the first direction, and the spacing of the same color sub-pixels in the first direction is approximately equal to 1 to 2 times of the width of the sub-pixels. The light-emitting parts of the light-emitting elements of the two adjacent first color sub-pixels are surrounded by a mesh of the conductive protection structure, a light-emitting part of a light-emitting element of a second color sub-pixel is surrounded by a mesh of the conductive protection structure, and a light-emitting part of a light-emitting element of a third color sub-pixel is surrounded by a mesh of the conductive protection structure.

In some exemplary embodiments, the signal terminal provides a constant potential.

In some exemplary embodiments, the substrate further includes a peripheral region located at the periphery of the display region and is provided with at least one constant voltage signal line, and the conductive protection structure is electrically connected with the signal terminal through the at least one constant voltage signal line.

In another aspect, the present disclosure provides a display apparatus, including the display substrate described above.

In another aspect, the present disclosure provides a method for preparing a display substrate, including: providing a substrate including a display region; and forming a plurality of sub-pixels and a conductive protection structure on the substrate of the display region. At least one sub-pixel includes a light-emitting element and a drive circuit for driving the light-emitting element to emit light, the light-emitting element and the conductive protection structure are located on a side of the drive circuit away from the substrate. The conductive protection structure includes at least one conductive part located at an interval between light-emitting parts of light-emitting elements of at least two adjacent sub-pixels; and the conductive protection structure is electrically connected with a signal terminal and configured to reduce carrier transmission between adjacent sub-pixels.

Other aspects may be understood upon reading and understanding of the accompanying drawings and detailed descriptions.

BRIEF DESCRIPTION OF DRAWINGS

The drawings provide a further understanding to the technical solutions of the present disclosure, form a part of the specification, and are adopted to explain, together with the embodiments of the present disclosure, the technical solutions of the present disclosure and not intended to form limits to the technical solutions of the present disclosure. The shapes and sizes of one or more components in the drawings do not reflect the true scale, and are only intended to schematically describe the contents of the present disclosure.

DETAILED DESCRIPTION

Figure 1:
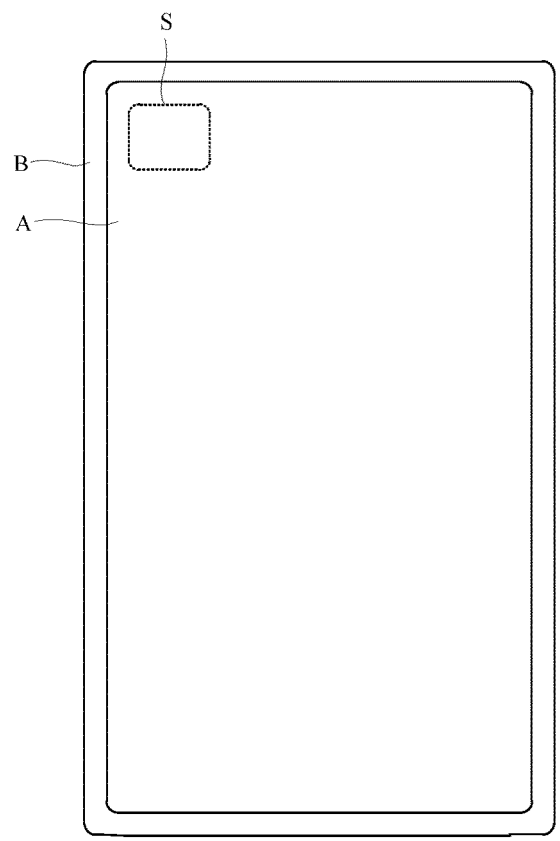
FIG. 1 is a schematic diagram of a display substrate according to at least one embodiment of the present disclosure.

In order to make the objects, technical solutions and advantages of the present disclosure more clear, the embodiments of the present disclosure will be described in detail below in combination with the drawings. Implementation modes may be implemented in various forms. Those of ordinary skills in the art may easily understand such a fact that implementation modes and contents may be transformed into one or more forms without departing from the purpose and scope of the present disclosure. Therefore, the present disclosure should not be construed as being only limited to the contents described in the following implementation modes. The embodiments in the present disclosure and features in the embodiments may be combined randomly with each other if there is no conflict.

In the drawings, size/sizes of one or more constituent elements, thicknesses of layers, or regions are sometimes exaggerated for clarity. Therefore, one mode of the present disclosure is not necessarily limited to the size, and a shape and size of each component in the accompanying drawings do not reflect true scale. In addition, the accompanying drawings schematically show ideal examples, and one mode of the present disclosure is not limited to a shape, a numerical value, or the like shown in the accompanying drawings.

Ordinal numerals such as "first", "second" and "third" in the present disclosure are set to avoid confusion of constituents, but not intended for restriction in quantity. In the description of the present disclosure, "a plurality of" means two or more than two.

In the present disclosure, sometimes for convenience, wordings "central", "up", "down", "front", "back", "vertical", "horizontal", "top", "bottom", "inside", "outside" and the like indicating orientation or positional relationships are used to illustrate positional relationships between constituent elements with reference to the drawings. These terms are not intended to indicate or imply that involved devices or elements must have specific orientations and be structured and operated in the specific orientations but only to facilitate describing the present specification and simplify the description, and thus should not be understood as limitations on the present disclosure. The positional relationships between the constituent elements may be changed as appropriate based on the directions according to which the constituent elements are described. Therefore, they are not limited to the wordings described in the specification, which may be replaced appropriately according to situations.

In the present disclosure, unless otherwise specified and defined, terms "mounting", "mutual connection" and "connection" should be understood in a broad sense. For example, a connection may be a fixed connection, or a detachable connection, or an integral connection, it may be a mechanical connection or an electrical connection, it may be a direct connection, or an indirect connection through an intermediate, or an internal communication between two elements. Those of ordinary skills in the art may understand meanings of the above terms in the present disclosure according to situations.

In the present disclosure, a transistor refers to an element including at least three terminals, namely, a gate electrode, a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source electrode. In the present disclosure, the channel region refers to a region through which the current mainly flows.

In the present disclosure, a first electrode may be a drain electrode while a second electrode may be a source electrode, or a first electrode may be a source electrode while a second electrode may be a drain electrode. In the case that transistors with opposite polarities are used, or that a direction of a current changes during operation of a circuit, or the like, functions of the "source electrode" and the "drain electrode" are sometimes exchanged. Therefore, the "source electrode" and the "drain electrode" are interchangeable in the present disclosure.

In the present disclosure, "an electrical connection" includes a case where constituent elements are connected via an element having a certain electrical function. There is no specific restriction on the "element having a certain electrical function" as long as it may transmit and receive electrical signals between connected constituent elements. Examples of the "element having a certain electrical function" not only include electrodes and wirings, but also include switch elements (such as transistors), resistors, inductors, capacitors, and other elements with one or more functions.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, sometimes a "conducting layer" may be replaced with a "conducting film". Similarly, sometimes an "insulating film" may be replaced with an "insulating layer".

In the present disclosure, "about" refers to that a boundary is defined not so strictly and numerical values in process and measurement error ranges are allowed.

An OLED light-emitting element includes an anode, an organic function layer and a cathode which are stacked in turn. The organic function layer may include an Emitting Layer (EML), as well as a multilayer structure formed by one or more film layers in a Hole Injection Layer (HIL), a Hole Transport Layer (HTL), a Hole Block Layer (HBL), an Electron Block Layer (EBL), an Electron Injection Layer (EIL), and an Electron Transport Layer (ETL). For example, under driving of voltages of the anode and the cathode, light is emitted according to the required gray scale using light-emitting properties of the organic materials.

The emitting layers of OLED emitting elements of different colors are different. For example, a red light-emitting element includes a red emitting layer, a green light-emitting element includes a green emitting layer, and a blue light-emitting element includes a blue emitting layer. In order to reduce the process difficulty and improve the yield, the hole injection layer and the hole transport layer located on a side of the emitting layer may be a common layer. In order to improve the efficiency of display products and reduce power consumption, the hole injection layer is generally formed by doping p-dopant (for example, F4-TCNQ) with deep energy level of Lowest Unoccupied Molecular Orbital (LUMO) and hole transport materials according to a certain proportion. There is significant spontaneous charge transfer between the injected material and the hole transport material, which leads to high conductivity of the hole injection layer. With the increase of resolution, the distance between adjacent sub-pixels of different colors become smaller, and with the development of material technology, the mobility of materials increases continuously in order to reduce voltage and power consumption. The current caused by the above two aspects may flow to adjacent sub-pixels that do not need to emit light through a common layer with strong conductivity (e.g., a hole injection layer), resulting in slight brightness of adjacent sub-pixels and crosstalk defect. Likewise, this phenomenon may occur when the mobility of other organic function layers as common layers such as hole transport layers, electron transport layers and the like is high.

In addition, when the organic function layer is prepared by evaporation (for example, evaporation with Fine Metal Mask (FMM) or Open Mask), crosstalk current may be generated at the interval between light-emitting regions of different colors due to the high mobility of some materials. Under low gray scale, the brightness deviation caused by crosstalk current will be obvious, which leads to the inability to accurately display the required colors, which seriously affects the color accuracy of display products under low gray scale.

At least one embodiment of the present disclosure provides a display substrate, a preparation method therefor and a display apparatus, which can avoid crosstalk defect and improve display effect.

At least one embodiment of the present disclosure provides a display substrate including a substrate. The substrate includes a display region, which is provided with a plurality of sub-pixels and a conductive protection structure. At least one of the plurality of sub-pixels includes a light-emitting element and a drive circuit for driving the light-emitting element to emit light. The light-emitting element and a conductive protection structure are located on a side of the drive circuit away from the substrate. The conductive protection structure includes at least one conductive part located at an interval between light-emitting parts of light-emitting elements of at least two adjacent sub-pixels. The conductive protection structure is electrically connected with a signal terminal and configured to reduce carrier transmission between adjacent sub-pixels.

In the display substrate provided by the embodiment, at least one conductive part is arranged at an interval between light-emitting parts of light-emitting elements of at least two adjacent sub-pixels, thereby reducing carrier transmission between adjacent sub-pixels, preventing current crosstalk between adjacent sub-pixels, and improving display effect.

In some exemplary embodiments, the at least one conductive part is located at an interval between light-emitting parts of light-emitting elements of at least two adjacent sub-pixels of different colors. The exemplary embodiment can avoid the influence of sub-pixels of one color on sub-pixels of other colors during monochrome display, thereby improving the display color accuracy and effectively improving the display quality. However, this embodiment is not limited thereto. In some examples, the at least one conductive part may be located at an interval between light-emitting parts of light-emitting elements of any two adjacent sub-pixels.

In some exemplary embodiments, a light-emitting element includes an organic function layer including at least two organic layers, and the at least one conductive part is in contact with at least one of the organic layers. For example, the at least two organic layers may include an emitting layer and a hole injection layer with at least one conductive part in contact with the hole injection layer. For another example, the at least two organic layers may include an emitting layer, a hole transport layer, and a hole injection layer with at least one conductive part in contact with the hole injection layer. However, this embodiment is not limited thereto.

In some exemplary embodiments, at least two organic layers include a first layer, wherein a projection of the first layer on a substrate at least is overlapped with the projection of the light-emitting parts of light-emitting elements of the two sub-pixels on the substrate, and the first layer is in contact with the at least one conductive part. In some examples, the first layer may be a common layer between light-emitting elements of a plurality of sub-pixels. Alternatively, the first layer may be shared by light-emitting elements of some of the plurality of sub-pixels. For example, the first layer may be a hole injection layer or a hole transport layer. However, this embodiment is not limited thereto.

In some exemplary embodiments, the resistivity of at least one conductive part is less than the resistivity of an organic layer contacting the at least one conductive part. In some examples, the organic layer contacting the at least one conductive part may be a hole injection layer, and the resistivity of the at least one conductive part is less than the resistivity of the hole injection layer. However, this embodiment is not limited thereto. For example, the organic layer contacting the at least one conductive part may be a hole transport layer.

In some exemplary embodiments, the display region is further provided with a pixel define layer located on a side of the drive circuit away from the substrate. The pixel define layer includes a plurality of sub-pixel definition parts, a pixel define layer opening is formed between adjacent sub-pixel definition parts, and the part of the light-emitting element located in the pixel define layer opening is used for light emission. The conductive protection structure is provided on a side of the sub-pixel definition part away from the substrate, and a projection of the sub-pixel definition part on the substrate covers a projection of the conductive protection structure on the substrate. In some examples, the pixel define layer within the pixel define layer opening is removed, corresponding to the light-emitting part of the light-emitting element. In some examples, the conductive protection structure is in direct contact with the sub-pixel definition part of the sub-pixel definition layer, or the conductive protection structure is in direct contact with a post spacer formed on the sub-pixel definition part. However, this embodiment is not limited thereto. In the present exemplary embodiment, the conductive protection structure is formed on the sub-pixel definition part so that the manufacturing process can be simplified and further the influence on the normal light emission of the light-emitting element can be avoided.

In some exemplary embodiments, at least one light-emitting element includes a first electrode, an organic function layer, and a second electrode that are sequentially stacked. A first electrode is disposed on a side of the drive circuit away from the substrate and electrically connected to one of the drive circuits, and a pixel define layer opening of the pixel define layer exposes at least a part of the first electrode. An organic function layer is disposed on a side of the first electrode away from the substrate, and is in contact with the first electrode through the pixel define layer opening. A second electrode is disposed on a side of the organic function layer away from the substrate, and is in contact with the organic function layer. In some examples, the first electrode may be a reflection anode, and the second electrode may be a transparent cathode. However, this embodiment is not limited thereto. For example, a first electrode may be a transparent anode, and a second electrode may be a reflective cathode.

In some exemplary embodiments, an organic function layer may include an emitting layer and at least one of a hole injection layer, a hole transport layer, an electron block layer, an electron injection layer, an electron transport layer, and a hole block layer. For example, the organic function layer may include a hole injection layer, a hole transporting layer, an emitting layer, an electron transporting layer, and an electron injection layer that are sequentially stacked in a direction away from the substrate. For another example, the organic function layer may include a hole injection layer, a hole transport layer, an emitting layer, and an electron transport layer that are sequentially stacked in a direction away from the substrate. However, this embodiment is not limited thereto.

In some exemplary embodiments, at least one of a hole injection layer, a hole transport layer, an electron block layer, an electron injection layer, an electron transport layer, and a hole block layer is a common layer between light-emitting elements of a plurality of sub-pixels. Each common layer is provided in a plurality of pixel define layer openings and extends cover a plurality of sub-pixel definition parts. In the present exemplary embodiment, the crosstalk current in the common layer flows to the conductive protection structure, which blocks the crosstalk current from flowing to other sub-pixels, avoids generating crosstalk defects, and improves the display effect. However, this embodiment is not limited thereto. In some examples, when the organic function layer is not provided with a common layer, the conductive protection structure may shield crosstalk current due to evaporation edge contact of the organic function layer of adjacent sub-pixels to avoid crosstalk occurred.

In some exemplary embodiments, the projection of the at least one conductive part on the substrate is overlapped with the projection of emitting layers of two sub-pixels on the substrate and is not overlapped with the projection of the pixel define layer opening on the substrate. In the present exemplary embodiment, at least one conductive part is not overlapped with the projection of the light-emitting part of the light-emitting element of the sub-pixel on the substrate, so as to avoid affecting the normal light emission of the light-emitting element. However, this embodiment is not limited thereto. In some examples, the projection of at least one conductive part on the substrate does not have to be overlapped with the projection of the emitting layer of the sub-pixel on the substrate.

In some exemplary embodiments, emitting layers of two sub-pixels are overlapped, and the projection of at least one conductive part on the substrate is overlapped with the projection of an overlapping part of the emitting layers of the two sub-pixels on the substrate. In some examples, emitting layers of adjacent sub-pixels may be overlapped, and at least one conductive part may be arranged at a position of the pixel define layer corresponding to the overlapping position of the emitting layers of adjacent sub-pixels. However, this embodiment is not limited thereto.

In some exemplary embodiments, the conductive protection structure may be electrically connected to the signal terminal through a second electrode of the light-emitting element. In some examples, a second electrode of the light-emitting element is electrically connected to a low-potential power supply line (or ground signal line) to provide a constant potential, and the conductive protection structure can be maintained at a constant potential by connecting the conductive protection structure to the second electrode of the light-emitting element. However, this embodiment is not limited thereto.

In some exemplary embodiments, voltage value of a signal terminal may be located between a minimum voltage value of a second electrode and a maximum voltage value of a first electrode of the light-emitting element. For example, the voltage value of the signal terminal may be greater than or equal to the minimum voltage value of the second electrode and less than the maximum voltage value of the first electrode. However, this embodiment is not limited thereto. In some examples, the voltage value at the signal terminal may be determined according to the display effect.

In some exemplary embodiments, the conductive protection structure is a mesh structure formed by at least one conductive part. The mesh structure includes at least one mesh that surrounds a light-emitting part of a light-emitting element of a sub-pixel or a light-emitting part of a light-emitting element of a plurality of adjacent sub-pixels of the same color. However, this embodiment is not limited thereto. In some examples, the conductive protection structure is a multi-row and multi-column cross structure formed by a plurality of conductive parts; alternatively, the conductive protection structure is a multi-column strip structure formed by a plurality of conductive parts.

In some exemplary embodiments, a plurality of sub-pixels in the display region are arranged according to a repeating unit including two first color sub-pixels, one second color sub-pixel and one third color sub-pixel in a first direction, wherein the two first color sub-pixels are arranged in a second direction perpendicular to the first direction, and the spacing of the same color sub-pixels in the first direction is approximately equal to 1 time to 2 times of the width of the sub-pixels. For example, the spacing of sub-pixels of the same color in a first direction is approximately equal to 1.5 times the width of the sub-pixels. The light-emitting parts of the light-emitting elements of the two adjacent first color sub-pixels are surrounded by a mesh of the conductive protection structure, a light-emitting part of a light-emitting element of one second color sub-pixel is surrounded by a mesh of the conductive protection structure, and a light-emitting part of a light-emitting element of one third color sub-pixel is surrounded by a mesh of the conductive protection structure. In other words, at least one mesh of the conductive protection structure surrounds the light-emitting part of light-emitting elements of two adjacent first color sub-pixel, or the light-emitting part of the light-emitting element of one second color sub-pixel, or the light-emitting part of the light-emitting element of one third color sub-pixel. In some examples, a first direction may be the row direction and a second direction may be the column direction. Or, the first direction may be a column direction, and the second direction may be a row direction. In some examples, a first color sub-pixel may be a Green (G) sub-pixel, a second color sub-pixel may be Red (R) sub-pixels, and a third color sub-pixel may be a Blue (B) sub-pixel. That is, a plurality of sub-pixels of the display region may be arranged according to the pattern of GGRB. In the present exemplary embodiment, at least one mesh of the conductive protection structure with a mesh structure surrounds a light-emitting part of the light-emitting elements of one or two adjacent sub-pixels of the same color. However, arrangement manner of the plurality of sub-pixels in the display region are not limited in this embodiment. In some examples, a plurality of sub-pixels within the display region may be arranged in an RGB pattern. For example, each row is arranged according to a repeating unit including a red sub-pixel, a green sub-pixel, and a blue sub-pixel, and the sub-pixels of each column have the same color. Alternatively, in some examples, a plurality of sub-pixels of the display region may be arranged in a PenTile pattern. For example, each pixel unit may include red sub-pixels and green sub-pixels, or blue sub-pixels and green sub-pixels, and each pixel unit may borrow another color sub-pixel of its adjacent pixel unit to form three primary colors.

In some exemplary embodiments, a signal terminal provides a constant potential. That is, the conductive protection structure is connected with a constant potential. The voltage value of the constant potential may be greater than or equal to the minimum voltage value of the cathode of the light-emitting element and less than the maximum voltage value of the anode.

In some exemplary embodiments, the substrate further includes a peripheral region located at the periphery of the display region and is provided with at least one constant voltage signal line, and the conductive protection structure is electrically connected with the signal terminal through the at least one constant voltage signal line. In some examples, the at least one conductive part of the conductive protection structure may be connected to the at least one constant voltage signal line of the peripheral region through at least one connection electrode. In some examples, the constant voltage signal line may be a low voltage power supply line (VSS), or a ground signal line, or various types of voltage lines as long as the voltage value satisfying the constant potential provided by the constant voltage signal line is greater than or equal to the minimum voltage value of the second electrode of the light-emitting element and less than the maximum voltage value of the first electrode. In some examples, the signal terminal may include a bonding electrode receiving a ground signal. For example, a constant voltage signal line may be connected to a bonding electrode for connecting a ground signal provided in a bonding region located on a side of the display region, and the conductive protection structure achieves ground connection by connecting to the constant voltage signal line. However, this embodiment is not limited thereto.

FIG. 1 is a schematic diagram of a display substrate according to at least one embodiment of the present disclosure. As shown in FIG. 1, the display substrate of the embodiment includes a display region A and a non-display region located at the periphery of the display region A. The non-display region includes a peripheral region B located at the periphery of the display region A, and a bonding region (not shown) located on a side of the display region A. The display region A is at least provided with a plurality of sub-pixels, and at least one sub-pixel of the plurality of sub-pixels includes a light-emitting element and a driving circuit for driving the light-emitting element to emit light. The bonding region at least includes a bonding circuit for connecting the signal lines of the plurality of sub-pixels to the external driving device. The bonding circuit may include a plurality of bonding electrodes bound to an external circuit board. The peripheral region B at least includes signal lines for transmitting voltage signals to a plurality of sub-pixels such as a low-potential power supply line (VSS). The present exemplary embodiment is not limited to the size and resolution of the display substrate. For example, the size of the display substrate may be a micro display size, a small or medium size, or a large size. For example, the resolution of the display substrate may be at least one of the following: 960×540, 1920×1080, 2560×1440, 3840×2160, and 7680× 4320.

Figure 2:
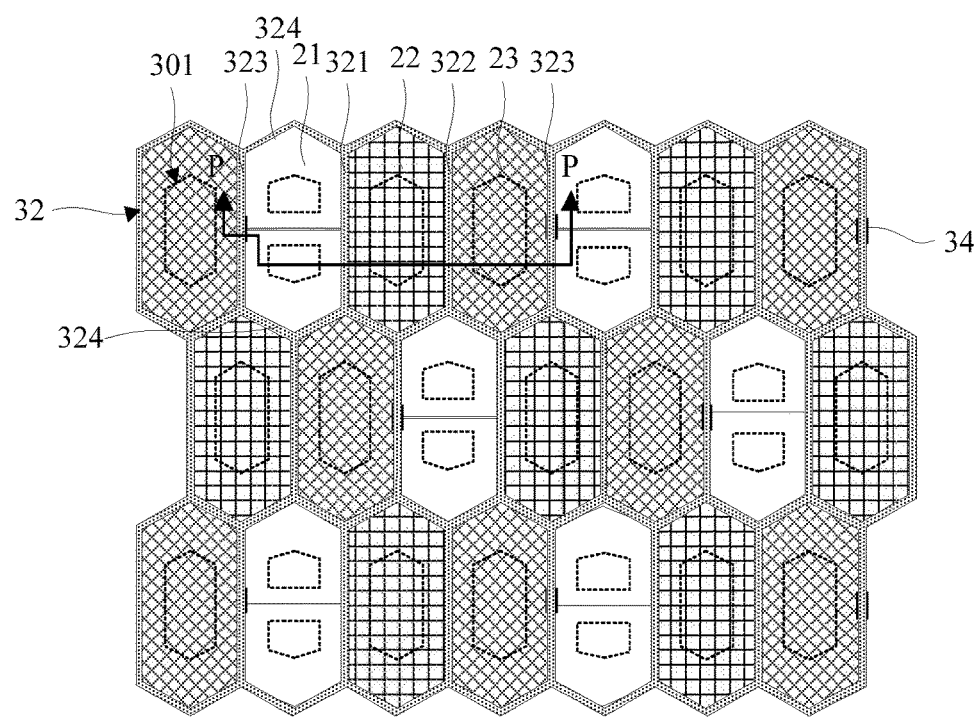
FIG. 2 is a schematic diagram of a structure of a plurality of sub-pixels in a display region according to at least one embodiment of the present disclosure.
Figure 3:
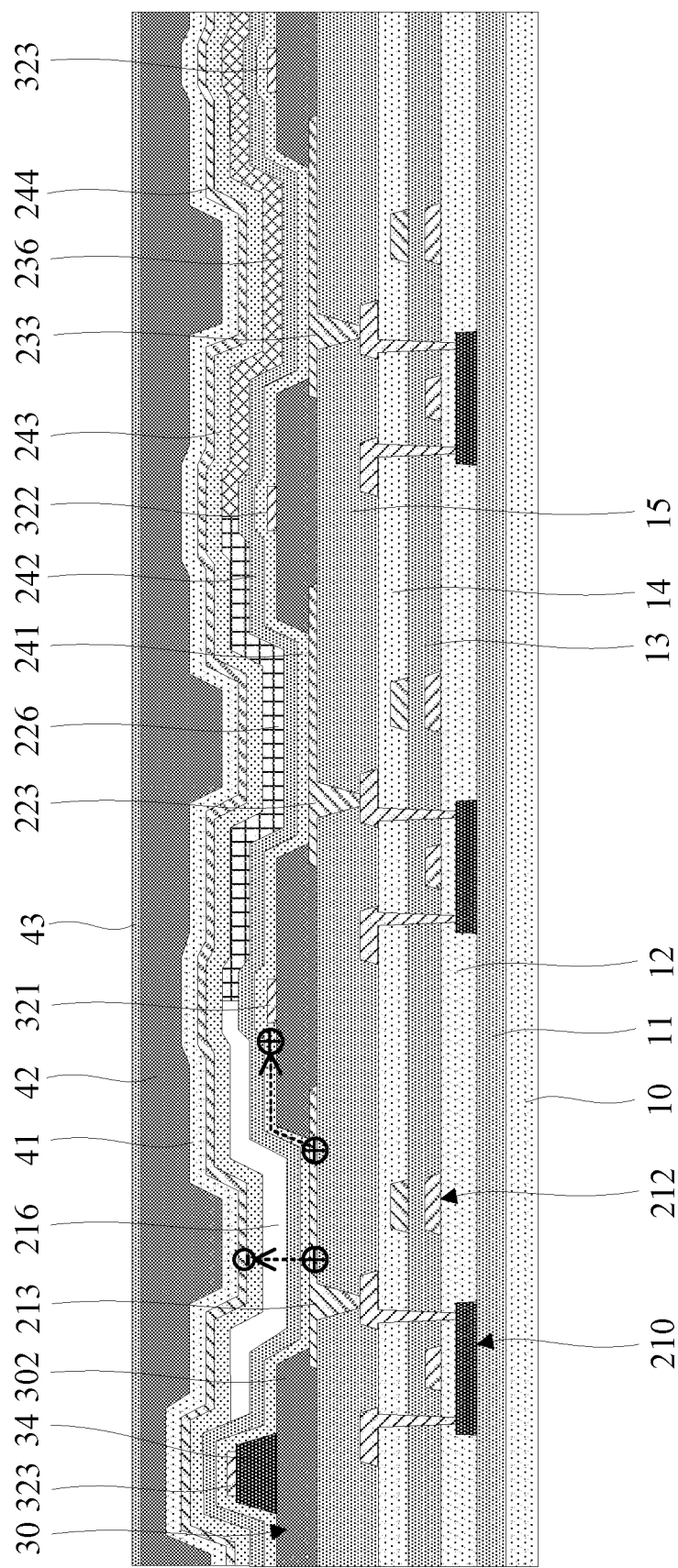
FIG. 3 is a schematic sectional view along a P-P direction in FIG. 2.

FIG. 2 is a schematic diagram of a structure of a plurality of sub-pixels in a display region according to at least one embodiment of the present disclosure. FIG. 2 is a partial enlarged schematic diagram of a region S in FIG. 1. FIG. 3 is a schematic sectional view along a P-P direction in FIG. 2.

In some exemplary embodiments, as shown in FIG. 2, on a plane parallel to the display substrate, a plurality of sub-pixels of the display region are arranged according to a repeating unit including two first color sub-pixels 21, one second color sub-pixel 22, and one third color sub-pixel 23 on each row, wherein the two first color sub-pixels 21 in the repeating unit are arranged in the column direction, and the spacing of the sub-pixels of the same color in the row direction is approximately equal to 1.5 times the width of the sub-pixels. In this example, the widths of the first color sub-pixel 21, the second color sub-pixel 22 and the third color sub-pixel 23 in the row direction may be the same. In other words, the repeating units between two adjacent rows have a distance of 1.5 times sub-pixel width in the row direction. The two first color sub-pixels 21 may be respectively pentagonal (e.g. rounded pentagonal) and the two first color sub-pixels 21 are symmetrical to each other and the axis of symmetry is parallel to the row direction. The second color sub-pixel 22 and the third color sub-pixel 23 are respectively hexagonal (e.g. rounded hexagonal). The lengths of the second color sub-pixels 22 and the third color sub-pixels 23 in the column direction may be the same. The length of the first color sub-pixel 21 in the column direction may be smaller than the lengths of the second color sub-pixel 22 and the third color sub-pixel 23. In some examples, a sub-pixel of a first color 21 may be a Green (G) sub-pixel, a second color sub-pixel 22 may be Red (R) sub-pixels, and a third color sub-pixel 23 may be a Blue (B) sub-pixel. Shapes and arrangement manner of the plurality of sub-pixels in the display region are not limited in this embodiment.

In some exemplary embodiments, as shown in FIG. 2, the display region is further provided with a conductive protection structure 32 with a mesh structure on a plane parallel to the display substrate. The conductive protection structure 32 with the mesh structure may be formed by connecting a plurality of conductive parts (including, for example, a first conductive part 321, a second conductive part 322, a third conductive part 323, and a fourth conductive part 324) located at intervals between light-emitting parts of light-emitting elements of adjacent sub-pixels of different colors. A part of the light-emitting element of the sub-pixel located in the pixel define layer opening 301 is used for light-emitting. In some examples, in the row direction, a first conductive part 321 is provided at an interval between the light-emitting part of the first color sub-pixel 21 and the light-emitting part of the adjacent second color sub-pixel 22 in the direction of two columns within one repeating unit; a second conductive part 322 is provided at an interval between the light-emitting part of the second color sub-pixel 22 and the light-emitting part of the adjacent third color sub-pixel 23. In the row direction, third conductive parts 323 are provided between adjacent repeating units. In the column direction, fourth conductive parts 324 are provided between repeating units in adjacent rows. Within one repeating unit, as a whole, the light-emitting parts of the light-emitting elements of the two first color sub-pixels 21 are surrounded by a first conductive part 321, a third conductive part 323 and fourth conductive parts 324 on the upper and lower sides after all of the conductive parts are connected to each other. A light-emitting part of a light-emitting element of a second color sub-pixel 22 is surrounded by a first conductive part 321, a second conductive part 322 and fourth conductive parts 324 on the upper and lower sides after all of the conductive parts are connected to each other, and a light-emitting part of a light-emitting element of a third color sub-pixel 23 is surrounded by a second conductive part 322, a third conductive part 323 and fourth conductive parts 324 on the upper and lower sides after all of the conductive parts are connected to each other. That is, in one repeating unit, the light-emitting part of the light-emitting elements of the two first color sub-pixels 21 is surrounded by a mesh of the mesh structure, the light-emitting part of the light-emitting elements of the second color sub-pixel 22 is surrounded by a mesh, and the light-emitting part of the light-emitting elements of the third color sub-pixel 23 is surrounded by a mesh. The light-emitting parts of light-emitting elements of adjacent sub-pixels with different colors are separated by conductive parts, thereby reducing carrier transmission between adjacent sub-pixels with different colors, avoiding current crosstalk and improving display effect. In some examples, a mesh formed by connecting a plurality of conductive parts around a light-emitting part of the light-emitting element of the sub-pixel may be hexagonal. However, this embodiment is not limited thereto. In some examples, a mesh formed by connecting a plurality of conductive parts around a light-emitting part of the light-emitting element of the sub-pixel may have another shape such as a rectangle or a pentagon. In addition, in some examples, the dimensions of the conductive parts at different positions of the display region may be the same, for example, the length of the conductive parts may be the same in a direction perpendicular to an extension direction of the conductive parts.

In some exemplary embodiments, as shown in FIG. 2, the display region is further provided with a plurality of post spacers 34 on a plane parallel to the display substrate. The spacer spacers 34 may be used as a support layer for supporting the FMM during the evaporation process. In some examples, a repeating unit is spaced between two adjacent post spacers 34 in the row direction of the sub-pixel arrangement. However, the position of the post spacer is not limited in the present embodiment.

In an exemplary embodiment, as shown in FIG. 3, on a direction perpendicular to the display substrate, the display region includes: a drive structure layer disposed on the substrate 10, a light-emitting structure layer disposed on a side of the drive structure layer away from the substrate 10, and a conductive protection structure. The driving structure layer includes a plurality of drive circuits, the light-emitting structure layer includes a plurality of light-emitting elements, and the plurality of light-emitting elements are connected with the plurality of drive circuits one by one. Each drive circuit includes a plurality of transistors and at least one storage capacitor, such as a 2T1C, 3T1C, 5T1C or 7T1C design. In FIG. 3, three sub-pixels are shown as an example, and the drive circuit of each sub-pixel only includes one transistor and one storage capacitor as an example.

In some exemplary embodiments, as shown in FIG. 3, on a plane perpendicular to the display substrate, at least one light-emitting element includes a first electrode (e.g. a first anode 213, a second anode 223, or a third anode 233), a hole injection layer 241, a hole transport layer 242, an emitting layer (e.g. a first color emitting layer 216, a second color emitting layer 226, or a third color emitting layer 236), an electron transport layer 243, and a second electrode 244 that are stacked in order. The display region is further provided with a pixel define layer 30 disposed on a side of the drive structure layer away from the substrate 10. The pixel define layer 30 includes a plurality of sub-pixel definition parts 302, a pixel define layer opening is formed between adjacent sub-pixel definition parts 302, and a part of the light-emitting element located in the pixel define layer opening is used for light emission. The conductive protection structure (including, for example, the first conductive part 321, the second conductive part 322, and the third conductive part 323 illustrated in FIG. 3) is provided on the side of the sub-pixel definition part 302 away from the substrate 10, and the conductive protection structure may be in direct contact with the sub-pixel definition part 302. The projection of the sub-pixel definition part 302 on the substrate 10 covers the projection of the conductive protection structure on the substrate 10. The projection of the conductive protection structure on the substrate 10 and the projection of the pixel define layer opening on the substrate are not overlapped. A plurality of first electrodes are disposed on a side of the driving structure layer away from the substrate 10. One first electrode is electrically connected to a drive circuit of the driving structure layer, and a pixel define layer opening of the pixel define layer 30 exposes at least part of the first electrodes. The hole injection layer 241, the hole transport layer 242, the electron transport layer 243, and the second electrode 244 are common layers of a plurality of light-emitting elements, which are provided in a plurality of pixel define layer openings, and extend to cover a plurality of sub-pixel definition parts 302. In some examples, the emitting layer may cover the pixel define layer opening and part of the sub-pixel definition parts around the pixel define layer opening. The second electrode 244 is provided on a side of the electron transport layer 243 away from the substrate 10 and covers the electron transport layer 243.

In some exemplary embodiments, as shown in FIG. 3, the first color emitting layer 216 and the second color emitting layer 226 are in direct contact on a plane perpendicular to the display substrate, and the projections of the first color emitting layer 216 and the second color emitting layer 216 on the substrate 10 are not overlapped. The second color emitting layer 226 and the third color emitting layer 236 are in direct contact and the projections of the second color emitting layer 226 and the third color emitting layer 236 on the substrate 10 are not overlapped. The projection of the first conductive part 321 on the substrate 10 is overlapped with the projection of the first color emitting layer 216 and the second color emitting layer 226 on the substrate 10. The projection of the second conductive part 322 on the substrate 10 is overlapped with the projection of the second color emitting layer 226 and the third color emitting layer 236 on the substrate 10. The projection of at least one third conductive part 323 on the substrate 10 is overlapped with the projection of the third color emitting layer 236. Projections of the first conductive part 321, the second conductive part 322 and the third conductive part 323 on the substrate 10 are not overlapped with the pixel define layer openings. In some examples the first conductive part 321 is located in the middle region of the sub-pixel definition part 302 away from the upper surface of the substrate 10. However, this embodiment is not limited thereto. For example, the first conductive part 321 may be located in a region of the sub-pixel definition part 302 near the first color emitting layer 216 or near the second color emitting layer 226 away from the upper surface of the substrate 10. The position of the second conductive part 322 and the third conductive part 323 may be similar to the position of the first conductive part 321, which will not be described here.

Figure 4:
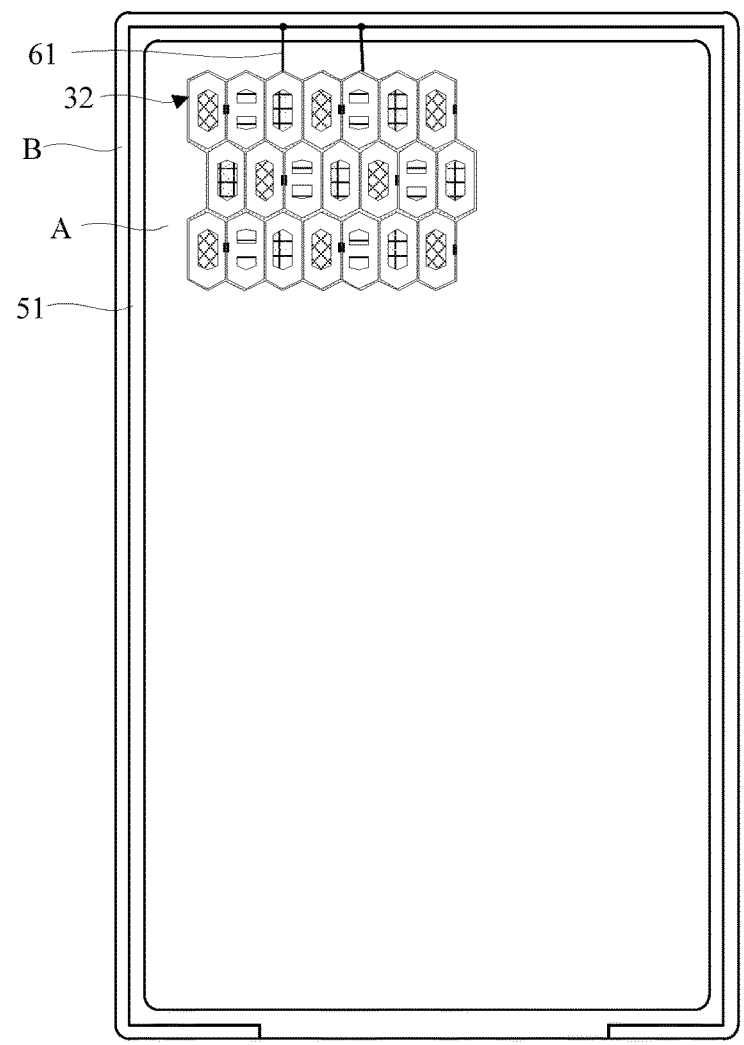
FIG. 4 is an electrical connection schematic diagram of a conductive protection structure of a display substrate according to at least one embodiment of the present disclosure.

FIG. 4 is an electrical connection schematic diagram of a conductive protection structure of a display substrate according to at least one embodiment of the present disclosure. As shown in FIGS. 2 and 4, in some exemplary embodiments, a constant voltage signal line 51 providing a constant potential is provided within the peripheral region B. At least one conductive part located at the outer edge of the conductive protection structure 32 may be electrically connected to the constant voltage signal line 51 of the peripheral region B through one or more connection electrodes 61. In some examples, at least one conductive part located on the side of the upper edge of conductive protection structure 32 near the display region A may be electrically connected to the constant voltage signal line 51 of the peripheral region B through a plurality of connection electrodes 61. However, this embodiment is not limited thereto. In some examples, the conductive part located on the left or right edge of the conductive protection structure 32 near the display region A may be electrically connected to the constant voltage signal line 51 of the peripheral region B through one or more connection electrodes 61. In some examples, the connection electrode 61 may include a second electrode of the light-emitting element. In other words, the conductive protection structure 32 may be connected to the constant voltage signal line 51 in the peripheral region B through the second electrode, thereby achieving shielding of crosstalk currents between adjacent light-emitting elements.

In some examples, the constant voltage signal line 51 of the peripheral region B may be connected to a bonding electrode receiving a ground signal within a bonding circuit of the bonding region, and the conductive protection structure 32 may be electrically connected to the constant voltage signal line 51 to achieve the ground connection of the conductive protection structure 32. However, this embodiment is not limited thereto. In some examples, the constant voltage signal line may be a voltage line that provides other potentials, as long as the voltage value of the constant potential provided by the constant voltage signal line is greater than or equal to the minimum voltage value of the cathode of the light-emitting element and less than the maximum voltage value of the anode. For example, the constant voltage signal line may be a low potential power line (VSS or VGL) or the like.

In some exemplary embodiments, as shown in FIGS. 2-4, when only the first color sub-pixel 21 is lit, that is, the first anode 213 of the first color sub-pixel 21 receives the drive current generated by the corresponding drive circuit, while the second anode 223 of the adjacent second color sub-pixel 22 does not receive the drive current generated by the corresponding drive circuit, because the hole injection layer 241 is a common layer of a plurality of sub-pixels, holes flowed out from the first anode 213 of the first color sub-pixel 21 will flow to the adjacent second color sub-pixel 22 through the common layer. In the present exemplary embodiment, the resistivity of the conductive protection structure 32 is smaller than that of the hole injection layer 241. By the shielding effect of the conductive protection structure 32, the holes flowed out from the first anode 213 of the first color sub-pixel 21 will flow to the conductive protection structure 32 with less resistivity, and further flow to the ground terminal or other constant potential signal terminal through the conductive protection structure 32, but not to the emitting layer of the second color sub-pixel 22, which can prevent the emitting layer of the second color sub-pixel 22 from emitting light under the action of the second electrode and the hole injection layer as a common layer. Taking the first color sub-pixel as a green sub-pixel and the second color sub-pixel as a red sub-pixel as an example, the situation that the adjacent red sub-pixels emit weak light when only the green sub-pixel is lit can be avoided. Likewise, the conductive protection structure can shield crosstalk currents between adjacent sub-pixels of other colors, the conductive protection structure can shield crosstalk currents when the conductivity of the common layer other than the hole injection layer is high, or when the conductivity of the non-common layer of the light-emitting element is high.

A structure of a display substrate according to an embodiment in the present disclosure is described below with an example of a manufacturing process of a display substrate. A "patterning process" mentioned in the present disclosure includes film layer deposition, photoresist coating, masking exposure, development, etching, photoresist stripping, and other treatment. The deposition may be any one or more of sputtering, evaporation, and chemical vapor deposition. The coating may be any one or more of spray coating and spin coating. The etching may be any one or more of dry etching and wet etching. A "thin film" refers to a layer of thin film made of a certain material by a deposition or coating process on an substrate. If the patterning process is not needed by the "thin film" throughout the preparation process, the "thin film" may also be referred to as a "layer". When a patterning process is further needed by the "thin film" throughout preparation process, the thin film is referred to as a "thin film" before the patterning process and referred to as a "layer" after the patterning process. The "layer" after the patterning process includes at least one "pattern".

"A and B are disposed on the same layer" mentioned in the present disclosure refers to that A and B are simultaneously formed by the same patterning process. The "same layer" does not always mean that the thickness of the layer or the height of the layer is the same in a sectional view. That "the projection of A includes that of B" refers to that the projection of B falls in a range of the projection of A or the projection of A covers the projection of B.

The process for preparing a display substrate of the present exemplary embodiment may include following acts (1) to (9). Descriptions are made in this exemplary embodiment taking a flexible display substrate with a top-emission structure as an example. FIGS. 5 to 13 are schematic cross-sectional views along P-P in FIG. 2.

(1) Preparing a substrate on a glass carrier plate.

Figure 5:
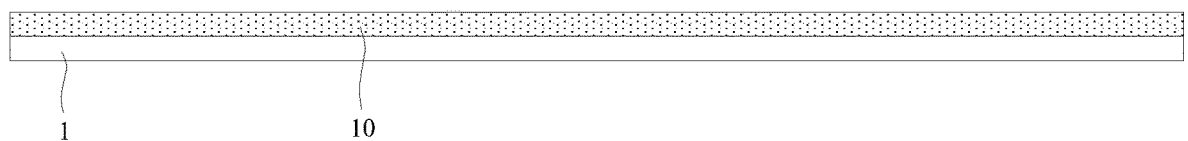
FIG. 5 is a schematic diagram of a display substrate after a flexible substrate is formed according to at least one embodiment of the present disclosure.

In some exemplary embodiments, the substrate 10 may be a flexible substrate which includes, for example, a first flexible material layer, a first inorganic material layer, a semiconductor layer, a second flexible material layer and a second inorganic material layer which are stacked on the glass carrier plate 1. The first second flexible material layer and second flexible material layer are made of polyimide (PI), polyethylene terephthalate (PET) or a surface-treated polymer soft film or the like. The first inorganic material layer and the second inorganic material layer are made of silicon nitride (SiNx) or silicon oxide (SiOx), which is used to improve the water and oxygen resistance of the substrate. The first inorganic material layer and the second inorganic material layer are also referred to as Barrier layers. The semiconductor layer is made of amorphous silicon (a-si). In some exemplary embodiment, taking the laminated structure PI1/Barrier1/a-si/PI2/Barrier2 as an example, the preparation process includes: coating a layer of polyimide on the glass carrier plate 1, and forming a first flexible (PI1) layer after curing to form a film; subsequently, depositing a layer of barrier film on the first flexible layer to form a first barrier (Barrier 1) layer covering the first flexible layer; then depositing a layer of amorphous silicon thin film on the first barrier layer to form an amorphous silicon (a-si) layer covering the first barrier layer; then coating a layer of polyimide on the amorphous silicon layer, and forming a second flexible (PI2) layer after curing to form a film; then depositing a layer of barrier thin film on the second flexible layer to form a second barrier (Barrier 2) layer covering the second flexible layer, to complete the preparation of the flexible substrate 10, as shown in FIG. 5.

Figure 6:
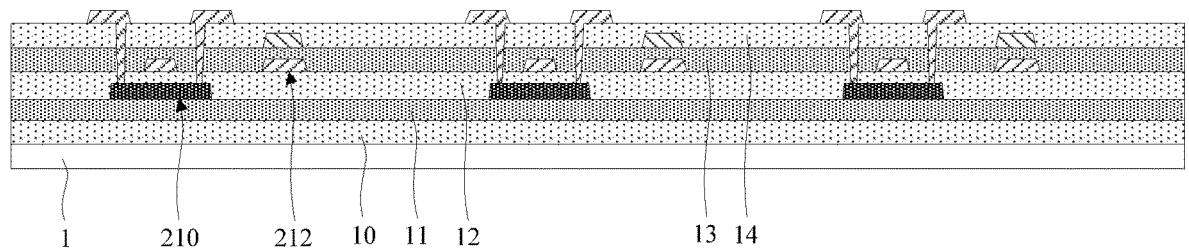
FIG. 6 is a schematic diagram of a display substrate after a drive structure layer is formed according to at least one embodiment of the present disclosure.

(2) Preparing a drive structure layer on the substrate. The drive structure layer includes a plurality of drive circuits, each of the drive circuits includes a plurality of transistors and at least one storage capacitor such as 2T1C, 3T1C or 7T1C designs. As shown in FIG. 6, three sub-pixels are shown as an example, and the drive circuit of each sub-pixel only includes one transistor and one storage capacitor as an example.

In some exemplary implementations, a preparation process of the driving structure layer may refer to the following descriptions. A preparation process of a drive circuit of a first color sub-pixel is described as an example.

A first insulating thin film and an active layer thin film are sequentially deposited on the substrate 10, the active layer thin film is patterned through a patterning process to form a first insulating layer 11 covering the entire substrate 10 and an active layer pattern disposed on the first insulating layer 11, wherein the active layer pattern includes at least the first active layer.

Then, a second insulating thin film and a first metal thin film are sequentially deposited, and the first metal thin film is patterned through a patterning process to form a second insulating layer 12 covering the active layer pattern and a first gate metal layer pattern disposed on the second insulating layer 12, wherein the first gate metal layer pattern includes at least a first gate electrode and a first capacitor electrode.

Then, a third insulating thin film and a second metal thin film are sequentially deposited, and the second metal thin film is patterned through a patterning process to form a third insulating layer 13 covering the first gate metal layer and a second gate metal layer pattern disposed on the third insulating layer 13, wherein the second gate metal layer pattern includes at least a second capacitor electrode, and the position of the second capacitor electrode corresponds to that of the first capacitor electrode.

Then, a fourth insulation thin film is deposited and patterned by the patterning process to form a pattern of a fourth insulation layer 14 covering the second gate metal layer, the fourth insulation layer 14 is provided with at least two first via holes where the fourth insulation layer 14, the third insulation layer 13 and the second insulation layer 12 are etched, exposing the surface of the first active layer.

Then, a third metal thin film is deposited and patterned by the patterning process, and a pattern of a source-drain metal layer is formed on the fourth insulation layer 14, and the source-drain metal layer at least includes a first source electrode and a first drain electrode located in the display region. The first source electrode and the first drain electrode are connected to the first active layer by a first via hole, respectively.

As shown in FIG. 6, in the drive circuit of the first color sub-pixel 100 in display region, the first active layer, the first gate electrode, the first source electrode and the first drain electrode may together form a first transistor 210, and the first capacitor electrode and the second capacitor electrode may together form a first storage capacitor 212. In the above-mentioned preparation process, the driving circuit of the second color sub-pixel and the driving circuit of the third color sub-pixel may be formed at the same time.

In some exemplary implementation modes, the first insulating layer 11, the second insulating layer 12, the third insulating layer 13 and the fourth insulating layer 14 are made of any one or more of silicon oxide (SiOx), silicon nitride (SiNx), and silicon oxynitride (SiON), and may be in a single-layer, multi-layer, or a composite layer. The first insulating layer 11 is referred to as a buffer layer, which is used to improve the water and oxygen resistance of the substrate; the second insulating layer 12 and the third insulating layer 13 are referred to as gate insulator (GI) layers; and the fourth insulating layer 14 is referred to as an interlayer dielectric (ILD) layer. The first metal thin film, the second metal thin film and the third metal thin film are made of metal materials, such as any one or more of Argentum (Ag), Copper (Cu), Aluminum (Al), Titanium (Ti), and Molybdenum (Mo), or alloy materials of the above-mentioned metals, such as an Aluminum-Neodymium alloy (AlNd) or a Molybdenum-Niobium alloy (MoNb), and may be in a single-layer structure, or a multilayer composite structures such as Ti/Al/Ti. The active layer thin film is made of one or more of the materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology and organics technology.

(3) Forming a planarization layer on the substrate on which the aforementioned patterns are formed.

Figure 7:
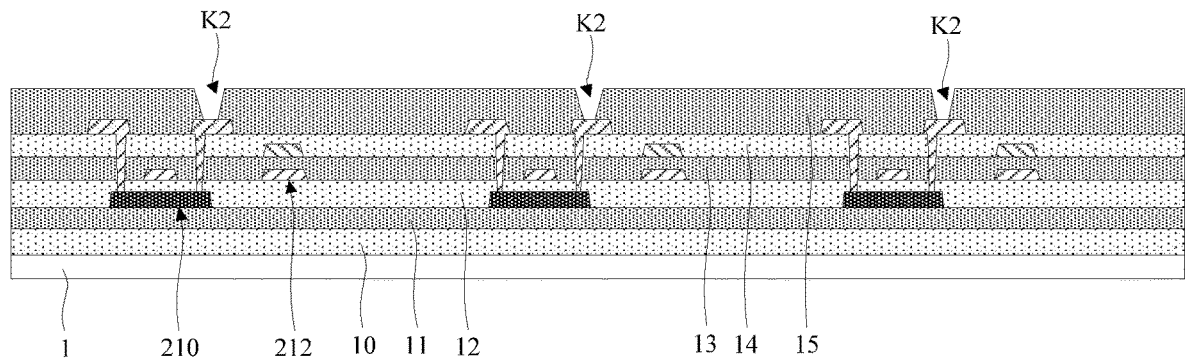
FIG. 7 is a schematic diagram of a display substrate after a pattern of a planarization layer is formed according to at least one embodiment of the present disclosure.

In some exemplary implementations, a flat thin film of an organic material is coated on the substrate on which the abovementioned patterns have been formed, so as to form a planarization (PLN) layer 15 covering the entire substrate 10. A plurality of second vias K2 are formed on the planarization layer 15 in the display region through masking, exposure and development processes as shown in FIG. 7. The planarization layer 15 in the plurality of second vias K2 is developed and removed, respectively exposing the surface of the first drain electrode of the first transistor 210 of the drive circuit of the first color sub-pixel 21, the surface of the first drain electrode of the first transistor of the drive circuit of the second color sub-pixel 22 and the surface of the first drain electrode of the first transistor of the drive circuit of the third color sub-pixel 23.

(4) Forming a pattern of the first electrode on the substrate on which the aforementioned patterns are formed. In some examples, the first electrodes are reflective anodes.

Figure 8:
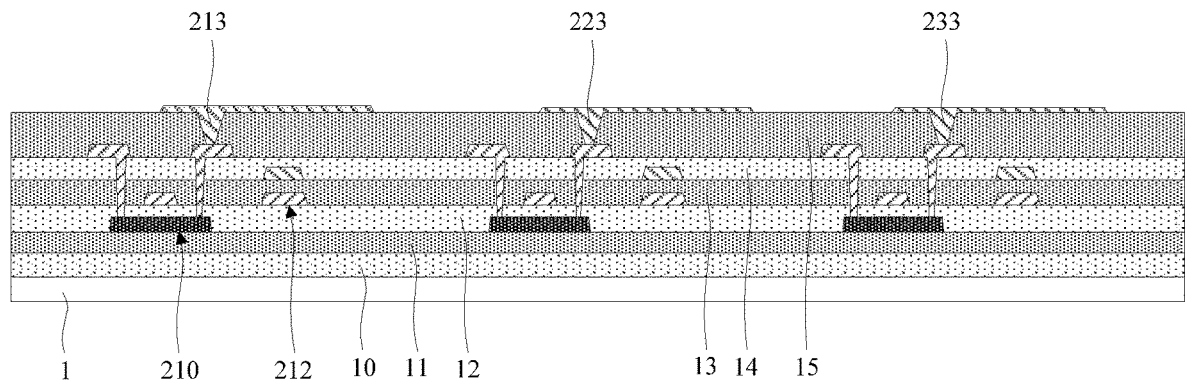
FIG. 8 is a schematic diagram of a display substrate after a pattern of a first electrode is formed according to at least one embodiment of the present disclosure.

In some exemplary implementations, a conductive thin film is deposited on the substrate 10 formed with the aforementioned patterns, and the conductive thin film is patterned through a patterning process to form the first electrode pattern. As shown in FIG. 8, the first anode 213 of the first color sub-pixel 21 is connected to the first drain electrode of the first transistor 210 through the second via K2, the second anode 223 of the second color sub-pixel 22 is connected to the first drain electrode of the first transistor of the second color sub-pixel 22 through the second via K2, and the third anode 233 of the third color sub-pixel 23 is connected to the first drain electrode of the first transistor of the third color sub-pixel 23 through the second via K2.

In some examples, the first electrodes may be made of a metal material, such as any one or more of Magnesium (Mg), Argentum (Ag), Copper (Cu), Aluminum (Al), Titanium (Ti) and Molybdenum (Mo), or alloy materials of the above-mentioned metals, such as an Aluminum-Neodymium alloy (AlNd) or a Molybdenum-Niobium alloy (MoNb), and may be of single-layer structures, or multilayer composite structures such as Ti/Al/Ti, or stacked structures formed by metals and transparent conductive materials such as Indium Tin Oxide (ITO)/Ag/ITO, Mo/AlNd/ITO and other reflective materials.

(5) Forming a pattern of a Pixel define layer (PDL) on the substrate on which the aforementioned patterns are formed.

Figure 9:
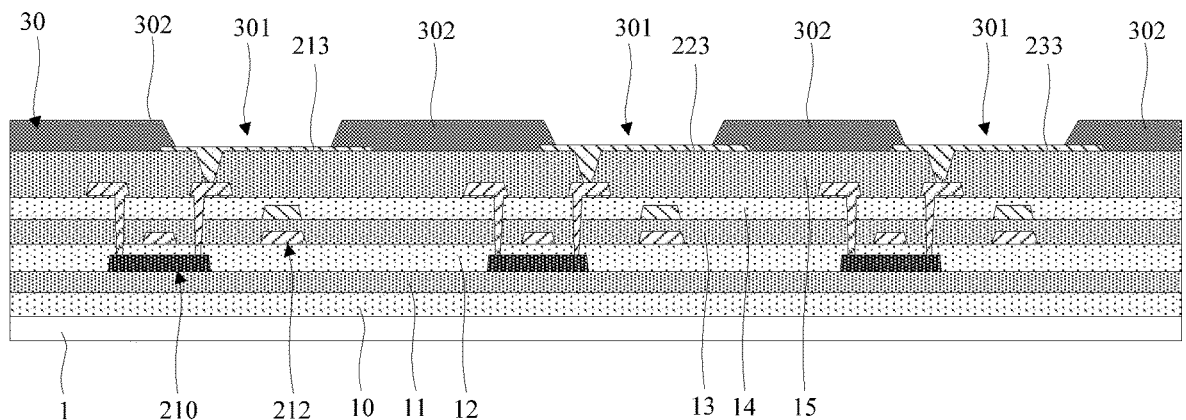
FIG. 9 is a schematic diagram of a display substrate after a pattern of a pixel define layer is formed according to at least one embodiment of the present disclosure.

In some exemplary implementations, a pixel definition thin film is coated on the substrate 10 on which the aforementioned patterns are formed, and a pattern of the pixel define layer is formed through masking, exposure, and development processes. As shown in FIG. 9, the pixel define layer 30 in the display region includes a plurality of sub-pixel definition parts 302, and a plurality of pixel define layer openings 301 are formed between adjacent sub-pixel definition parts 302. The pixel define layers 30 in the plurality of pixel define layer openings 301 are developed, exposing at least part of the surface of the first anode 213 of the first color sub-pixel 21, at least part of the surface of the second anode 223 of the second color sub-pixel 22, and at least part of the surface of the third anode 233 of the third color sub-pixel 23 respectively.

In some examples, the pixel define layer 30 may be made of polyimide, acrylic, or polyethylene terephthalate.

(6) Forming a pattern of a Post Spacer (PS) on a substrate on which the aforementioned patterns are formed.

Figure 10:
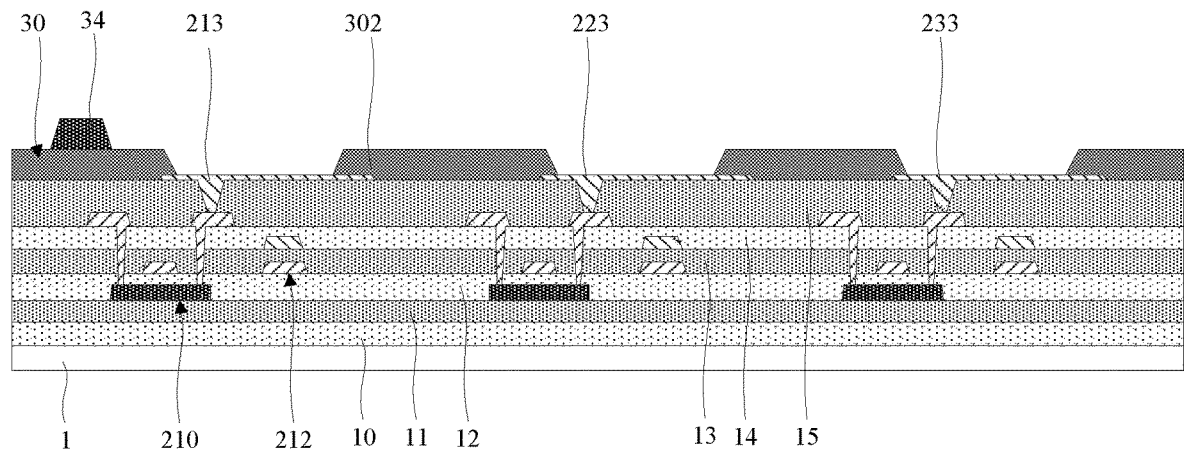
FIG. 10 is a schematic diagram of a display substrate after a pattern of a post spacer is formed according to at least one embodiment of the present disclosure.

In some exemplary implementations, the substrate 10 with the above-mentioned patterns formed is coated with an organic material thin film. A pattern of a post spacer 34 is formed by masking, exposure and development processes, as shown in FIG. 10. The post spacer 34 may be used as a support layer for supporting the FMM during the evaporation process. In some examples, as shown in FIG. 2, one repeating unit is spaced between two adjacent post spacers 34 along the row arrangement direction of the sub-pixels, for example, the post spacers 34 may be located between adjacent first color sub-pixels 21 and third color sub-pixels 23.

(7) Forming a conductive protection structure on the substrate on which the aforementioned patterns are formed.

Figure 11:
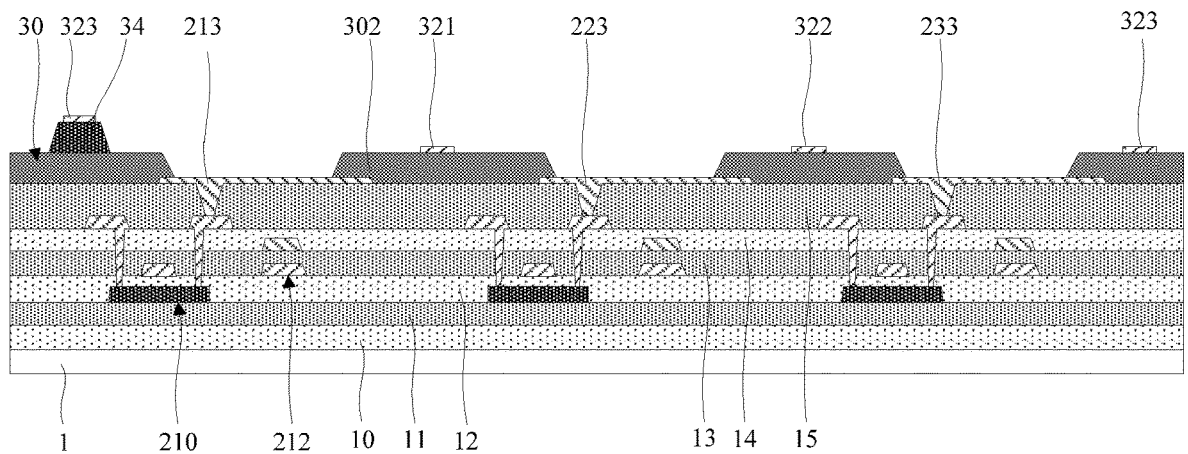
FIG. 11 is a schematic diagram of a display substrate after a pattern of a conductive protection structure is formed according to at least one embodiment of the present disclosure.

In some exemplary embodiments, a conductive thin film is deposited on the substrate 10 with the above-mentioned patterns formed. The conductive thin film is patterned through a patterning process to form a pattern of a conductive protection structure, as shown in FIG. 11. The conductive protection structure 32 includes a plurality of conductive parts (for example including a first conductive part 321 a second conductive part 322 a third conductive part 323 and a fourth conductive part 324) which are connected to form a mesh structure. In some examples, as shown in FIG. 2, the light-emitting part of the light-emitting elements of the two first color sub-pixels 21 are as a whole, surrounded by the first conductive part 321, the third conductive part 323, and the fourth conductive part 324. the light-emitting part of the light-emitting element of the second color sub-pixel 22 is surrounded by the first conductive part 321, the second conductive part 322, and the fourth conductive part 324, and the light-emitting part of the light-emitting element of the third color sub-pixel 23 is surrounded by a second conductive part 322, a third conductive part 323 and a fourth conductive part 324.

As shown in FIGS. 2 and 11, at least one third conductive part 323 is located on a post spacer 34 or a sub-pixel definition part 302 between adjacent third color sub-pixels 23 and first color sub-pixels 21, the first conductive part 321 is located on a sub-pixel definition part 302 between adjacent first color sub-pixels 21 and second color sub-pixels 22, and the second conductive part 322 is located on a sub-pixel definition part 302 between adjacent second color sub-pixels 22 and third color sub-pixels 23. The projection of the conductive protection structure 32 on the substrate 10 is within the projection of the sub-pixel definition part 302 on the substrate 10. In other words, the projection of the conductive protection structure 32 on the substrate 10 and the projection of the pixel define layer opening 301 on the substrate 10 are not overlapped, the conductive protection structure 32 is not connected to the plurality of first electrodes (for example, the first anode 213, the second anode 223, and the third anode 233), and regular display of the light-emitting element is not affected.

In some examples, the conductive protection structure may be made of metal materials, such as any one or more of silver (Ag), gold (Au), copper (Cu), aluminum (Al), titanium (Ti) and molybdenum (Mo), or an alloy material of the above metal, such as an aluminum-neodymium alloy (AlNd) or a molybdenum-niobium alloy (MoNb). Alternatively, the conductive protection structure may be made of a transparent conductive material, such as indium tin oxide (ITO) or indium zinc oxide (IZO), may be a single-layer structure, or a multi-layer composite structure, such as a multi-layer metal composite structure, such as Ti/Al/Ti, etc., or a composite structure of a transparent conductive material and a metal material, such as ITO (thickness range 5 nm to 20 nm)/Ag (thickness range 50 to 200 nm)/ITO (thickness range 5 nm to 20 nm). In some examples, the material of the conductive protection structure may be the same as the material of the first electrode.

In some exemplary embodiments, a conductive protection structure is coupled to a signal terminal that provides a constant potential. The conductive protection structure allows the crosstalk current generated by the common layer of the light-emitting element to flow to the signal terminal, shields the crosstalk current between the light-emitting elements of adjacent sub-pixels, thereby improving the accuracy of color display. In some examples, since the conductive protection structure is a mesh structure, it is possible to connect the entire conductive protection structure to the signal terminal by connecting the conductive part of the outer edge of the conductive protection structure to the signal terminal. For example, the conductive part of the outer edge of the conductive protection structure may be connected to a constant voltage signal line providing a constant potential in the peripheral region through a connection electrode. The constant voltage signal line may be connected with the bonding electrode which receives the ground signal in the bonding circuit of the bonding region, and the conductive protection structure achieves ground connection by connecting the constant voltage signal line. In some examples, the connection electrodes and the constant voltage signal lines may be disposed in the same layer as the source-drain metal layer, and the connection electrodes are electrically connected to the constant voltage signal lines. The conductive part is electrically connected to the connection electrode through vias provided in the pixel define layer and the planarization layer. However, this embodiment is not limited thereto.

(8) Sequentially forming an organic function layer and a second electrode on the substrate where the abovementioned patterns are formed. In some examples, the second electrode is a transparent cathode. The light-emitting element may emit light from a side away from the substrate 10 through the transparent cathode so as to achieve top emission. In some examples, the organic function layer of the light-emitting element include: a hole injection layer, a hole transport layer, an emitting layer, and an electron transport layer.

Figure 12:
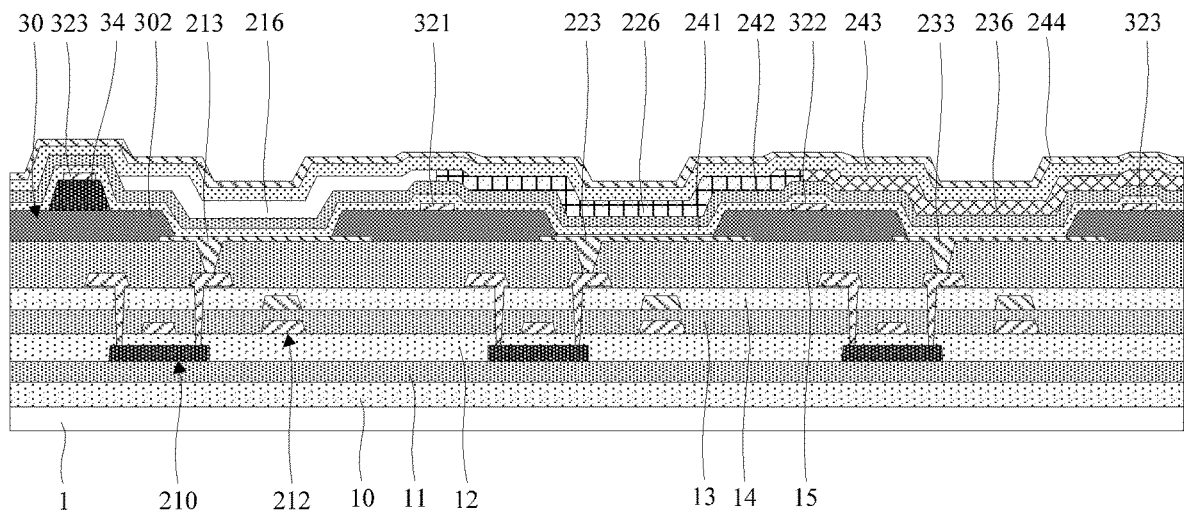
FIG. 12 is a schematic diagram of a display substrate after a pattern of a second electrode of a light-emitting element is formed according to at least one embodiment of the present disclosure.

In some exemplary embodiments, a hole injection layer 241 and a hole transport layer 242 are formed by sequential evaporation using an Open Mask on a substrate 10 on which the aforementioned patterns are formed. Then a blue emitting layer 236, a green emitting layer 216 and a red emitting layer 226 are sequentially formed by evaporation using FMM, and an electron transport layer 243 and a second electrode 244 are formed by sequential evaporation using an open mask, as shown in FIG. 12. The hole injection layer 241, the hole transport layer 242, the electron transport layer 243 and the second electrode 244 are all common layers of a plurality of sub-pixels. In some examples, the organic function layer may further include a microcavity adjustment layer located between the hole transport layer and the emitting layer. For example, a blue microcavity adjustment layer, a blue emitting layer, a green microcavity adjustment layer, a green emitting layer, a red microcavity adjustment layer, and a red emitting layer may be formed by sequential evaporation using FMM after the hole transport layer is formed.

In some exemplary implementations, the organic function layer is formed in a sub-pixel region to implement the connection between the organic function layer and the first electrodes. The second electrode is formed on the pixel define layer and is connected with the organic function layer.

In some exemplary implementations, the second electrode may be made of any one or more of Magnesium (Mg), Argentum (Ag) and Aluminum (Al), or an alloy made of any one or more of the above-mentioned metals, or a transparent conductive material such as Indium Tin Oxide (ITO), or may be a multilayer composite structure of metals and transparent conductive materials.

In some exemplary implementation, an optical coupling layer may be formed at a side of the second electrode 244 away from the substrate 10. The optical coupling layer may be an intercommunicated layer of a plurality of sub-pixels. The optical coupling layer may be cooperated with the transparent electrode so as to increase a light output. For example, a material of the optical coupling layer may be a semiconductor material. However, this embodiment is not limited thereto.

(9) Forming an encapsulation layer on the substrate with the above-mentioned patterns formed.

Figure 13:
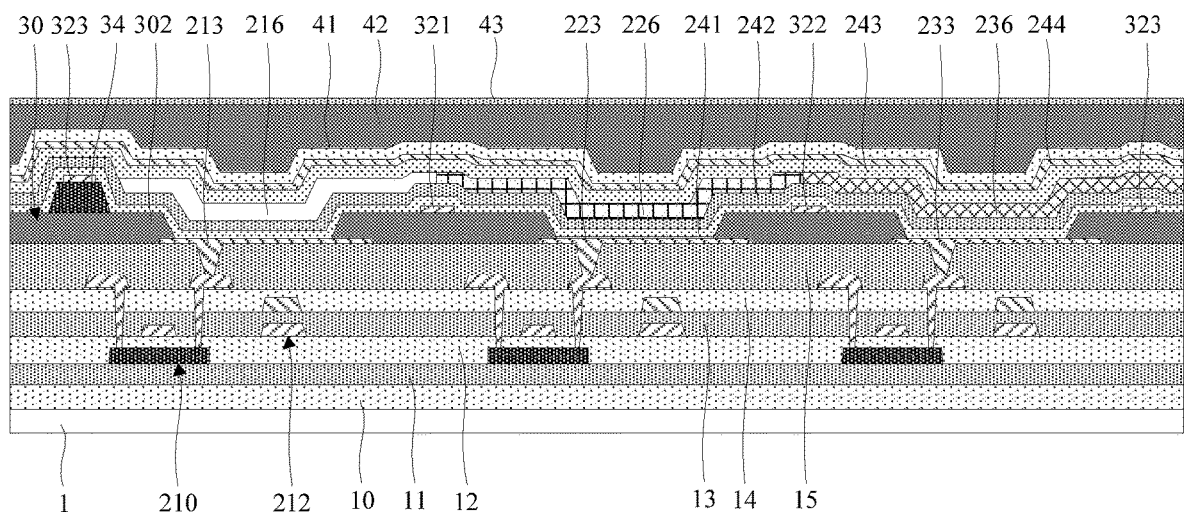
FIG. 13 is a schematic diagram of a display substrate after an encapsulation layer is formed according to at least one embodiment of the present disclosure.

In some exemplary implementations, an encapsulation layer is formed on the substrate where the abovementioned patterns are formed, and the encapsulation layer may include a first encapsulation layer 41, a second encapsulation layer 42 and a third encapsulation layer 43 which are stacked, as shown in FIG. 13. The first encapsulation layer 41 is made of an inorganic material, and covers the cathode in the display region. The second encapsulation layer 42 is made of an organic material. The third encapsulation layer 43 is made of an inorganic material and covers the first encapsulation layer 41 and the second encapsulation layer 42. However, this embodiment is not limited thereto. In some examples, the encapsulation layer may be of an inorganic/organic/inorganic/organic/inorganic five-layer structure.

By forming a conductive protection structure with a mesh structure on a pixel define layer, the display substrate provided in the embodiment allows crosstalk current in a common layer with higher conductivity of a light-emitting element to flow to the conductive protection structure, which shields crosstalk current transmitted by the common layer, avoids generating crosstalk display, and improves display effect. In the display substrate provided by the embodiment, the conductivity of a common layer (for example, a hole injection layer) does not need to be reduced, and the power consumption of the display substrate can be ensured, thereby improving the display effect.

The structure of the display substrate of the embodiment of the present disclosure and the preparation process thereof are described only as an example. In some exemplary embodiments, changes in corresponding structures and, addition or deletion of patterning processes may be made according to actual needs. For example, the display substrate may be a display substrate of a bottom-emission structure. As another example, the organic function layer may further include at least one of an electron block layer, a hole block layer, and an electron injection layer. As another example, the organic function layer of the light-emitting element may not be provided with a common layer. However, the present disclosure is not limited thereto.

Figure 14:
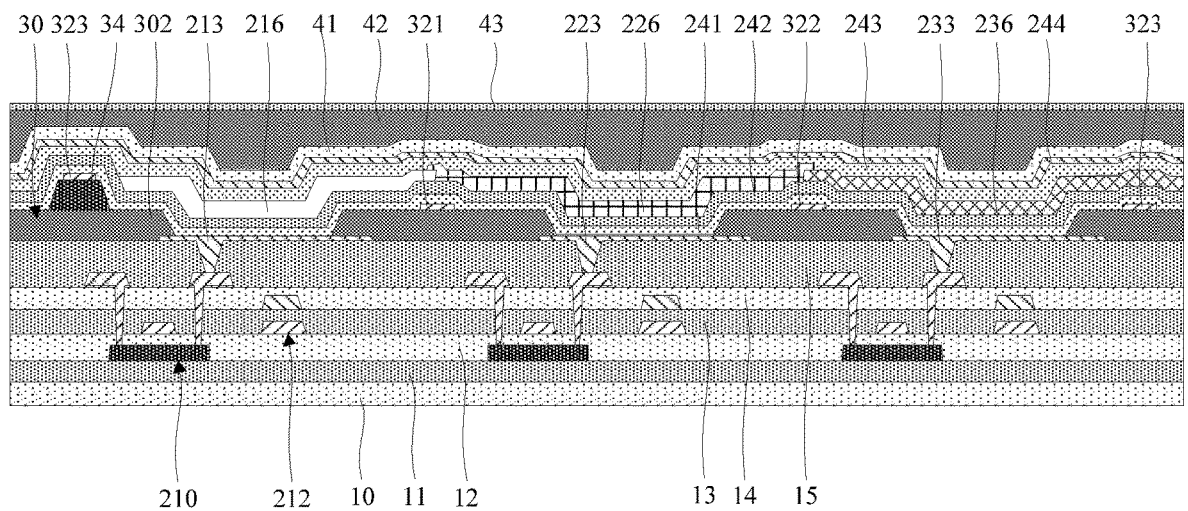
FIG. 14 is another schematic sectional view along the P-P direction in FIG. 2.

FIG. 14 is another schematic sectional view along a P-P direction in FIG. 2. In some exemplary embodiments, as shown in FIG. 14, in a plane perpendicular to the display substrate, the first color emitting layer 216 is overlapped with the second color emitting layer 226, and the second color emitting layer 226 is overlapped with the third color emitting layer 236. The projection of the first conductive part 321 on the substrate 10 is overlapped with the projection of the overlapping part of the first color emitting layer 216 and the second color emitting layer 226 on the substrate 10. The projection of the second conductive part 322 on the substrate 10 is overlapped with the projection of the overlapping part of the second color emitting layer 226 and the third color emitting layer 236 on the substrate 10. Other structures of this embodiment may be referred to the descriptions of the above embodiments and will not be further illustrated here.

Figure 15:
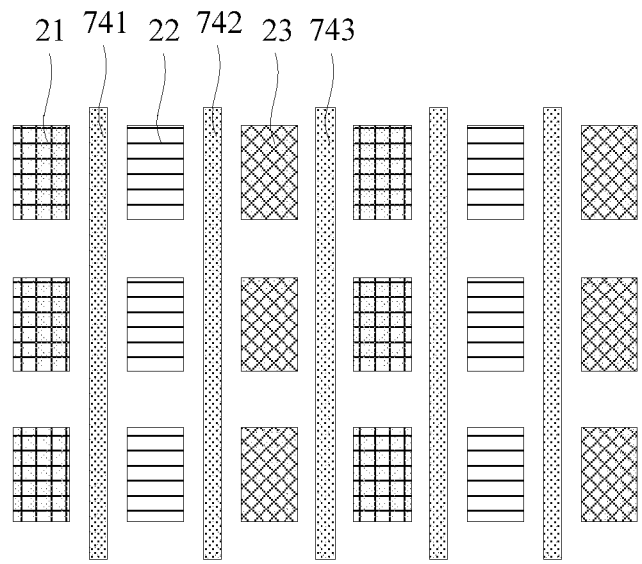
FIG. 15 is another schematic diagram of a plurality of sub-pixels in a display region according to at least one embodiment of the present disclosure.

FIG. 15 is another schematic diagram of a plurality of sub-pixels in a display region according to at least one embodiment of the present disclosure. In some exemplary embodiments, as shown in FIG. 15, a plurality of sub-pixels of the display region are arranged according to a repeating unit including one first color sub-pixel 21, one second color sub-pixel 22, and one third color sub-pixel 23 on each row. In the column direction, the color of sub-pixels in each column is the same. Each sub-pixel can be rectangular (for example, rounded rectangle). Sub-pixels of different colors have approximately the same width along the row direction, and sub-pixels of different colors have approximately the same length along the column direction. In some examples, the first color sub-pixel 21 may be a red sub-pixel, the second color sub-pixel 22 may be a green sub-pixel, and the third color sub-pixel 23 may be a blue sub-pixel. However, this embodiment is not limited thereto.

In some exemplary embodiments, the conductive protection structure includes at least one first conductive part 741, at least one second conductive part 742 and at least one third conductive part 743. At least one first conductive part 741 is located at an interval between light-emitting parts of the light-emitting elements of the adjacent first color sub-pixels 21 and the second color sub-pixels 22; at least one second conductive part 742 is located at an interval between light-emitting parts of the light-emitting elements of the adjacent second color sub-pixels 22 and the third color sub-pixels 23; and at least one third conductive part 743 is located at an interval between light-emitting parts of the light-emitting elements of the third color sub-pixel 23 and the first color sub-pixel 21 in the adjacent repeating unit. In some examples, when the first conductive parts 741, the second conductive parts 742, and the third conductive parts 743 are all plural, the plurality of first conductive parts 741 in the same column may be of an integrated structure, the plurality of second conductive parts 742 in the same column may be of an integrated structure, and the plurality of third conductive parts 743 in the same column may be of an integrated structure, thereby forming a plurality of strip structures parallel to the column direction. However, this embodiment is not limited thereto. In some examples, only the first conductive part 741 and the second conductive part 742 may be provided when only monochrome display of the second color sub-pixels needs to be ensured. In some examples, each strip structure of the conductive protection structure may respectively extend to the peripheral region, connected to a constant voltage signal line providing a constant potential within the peripheral region. However, this embodiment is not limited thereto.

In the present exemplary embodiment, by providing conductive parts between adjacent light-emitting elements of different colors, it is possible to avoid a case where light-emitting elements of other colors are lit at the time of monochrome display, thereby improving the display effect.

Other structures of display regions in the exemplary embodiments are similar to corresponding structures described in the foregoing embodiments, which hence will not be repeated here. The structure (or method) shown in this embodiment may be combined with structures (or methods) shown in other embodiments as appropriate.

Figure 16:
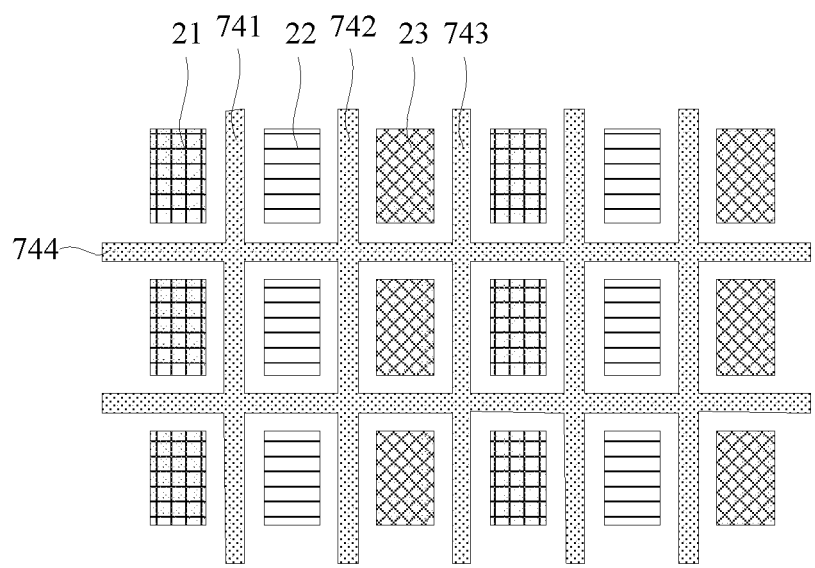
FIG. 16 is yet another schematic diagram of a plurality of sub-pixels in a display region according to at least one embodiment of the present disclosure.

FIG. 16 is another schematic diagram of a plurality of sub-pixels in a display region according to at least one embodiment of the present disclosure. In some exemplary embodiments, as shown in FIG. 16, a plurality of sub-pixels of the display region are arranged according to a repeating unit including one first color sub-pixel 21, one second color sub-pixel 22, and one third color sub-pixel 23 on each row. In the column direction, the color of sub-pixels in each column is the same. Each sub-pixel can be rectangular (for example, rounded rectangle). Sub-pixels of different colors have approximately the same width along the row direction, and sub-pixels of different colors have approximately the same length along the column direction. In some examples, the first color sub-pixel 21 may be a red sub-pixel, the second color sub-pixel 22 may be a green sub-pixel, and the third color sub-pixel 23 may be a blue sub-pixel. However, this embodiment is not limited thereto.

In some exemplary embodiments, a conductive part is provided at intervals between light-emitting parts of light-emitting elements of any two adjacent sub-pixels. A first conductive part 741 is provided at the interval between the light-emitting parts of the light-emitting elements of the adjacent first-color sub-pixels 21 and the second-color sub-pixels 22, a second conductive part 742 is provided at the interval between the light-emitting parts of the light-emitting elements of the adjacent second-color sub-pixels 22 and the third-color sub-pixels 23, and a third conductive part 743 is provided at the interval between the light-emitting parts of the light-emitting element of the third-color sub-pixel 23 in one repeating unit and the light-emitting element of the first-color sub-pixel 21 in an adjacent repeating unit. A fourth conductive part 744 is provided between repeating units in adjacent rows. In some examples, when the first conductive part 741, the second conductive part 742, the third conductive part 743, and the fourth conductive part 744 are all plural, the plurality of fourth conductive parts 744 located in the same row may be of an integrated structure, the plurality of first conductive parts 741 in the same column may be of an integrated structure, the plurality of second conductive parts 742 in the same column may be of an integrated structure, and the plurality of third conductive parts 743 in the same column may be of an integrated structure, thereby forming a plurality of rows and columns of cross structures. In this way, the light-emitting part of the light-emitting element of each sub-pixel is separated from the light-emitting part of the light-emitting element adjacent to its four sides by the conductive protection structure, thereby shielding the crosstalk current of the adjacent sub-pixels and improving the display effect.

In some exemplary embodiments, strip structures of any row or any column of conductive protection structures may extend to a peripheral region, connected to constant voltage signal lines providing a constant potential within the peripheral region. However, this embodiment is not limited thereto.

The structures of display regions in the exemplary embodiments are similar to corresponding structures described in the foregoing embodiments, which hence will not be repeated here. The structure (or method) shown in this embodiment may be combined with structures (or methods) shown in other embodiments as appropriate.

Figure 17:
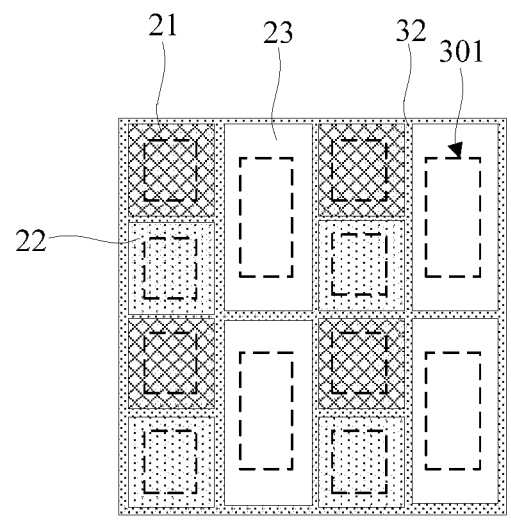
FIG. 17 is still another schematic diagram of a plurality of sub-pixels in a display region according to at least one embodiment of the present disclosure.

FIG. 17 is another schematic diagram of a plurality of sub-pixels in a display region according to at least one embodiment of the present disclosure. In some exemplary embodiments, as shown in FIG. 17, a plurality of sub-pixels of the display region are arranged according to a repeating unit including one first color sub-pixel 21, one second color sub-pixel 22 and one third color sub-pixel 23 sequentially arranged in a first direction (e.g. row direction) and a second direction (e.g. column direction) perpendicular to the first direction. In one repeating unit, the first color sub-pixels 21 and the second color sub-pixels 22 are arranged in a second direction, and the third color sub-pixels 23 are arranged on a side of the first color sub-pixels 21 and the second color sub-pixels 22. The lengths of the first color sub-pixel 21, the second color sub-pixel 22, and the third color sub-pixel 23 in the first direction are substantially the same, and the lengths of the first color sub-pixel 21 and the second color sub-pixel 22 in the second direction are substantially the same, and are smaller than the length of the third color sub-pixel 23 in the second direction. In some examples, the first color sub-pixel 21 may be a blue sub-pixel, the second color sub-pixel 22 may be a red sub-pixel, and the third color sub-pixel 23 may be a green sub-pixel. However, this embodiment is not limited thereto.

In some exemplary embodiments, as shown in FIG. 17, the conductive protection structure 32 includes at least one conductive part located at an interval between light-emitting parts of light-emitting elements of at least two adjacent sub-pixels. The conductive protection structure 32 is formed with a plurality of meshes, wherein at least one mesh may be rectangular. At least one mesh surrounds a light-emitting part of a light-emitting element of a first color sub-pixel 21, or surrounds a light-emitting part of a light-emitting element of a second color sub-pixel 22, or surrounds a light-emitting part of a light-emitting element of a third color sub-pixel 23. A light-emitting part of the light-emitting element of any sub-pixel is a part located at the pixel define layer opening 301.

The structures of display regions in the exemplary embodiments are similar to corresponding structures described in the foregoing embodiments, which hence will not be repeated here. The structure (or method) shown in this embodiment may be combined with structures (or methods) shown in other embodiments as appropriate.

Figure 18:
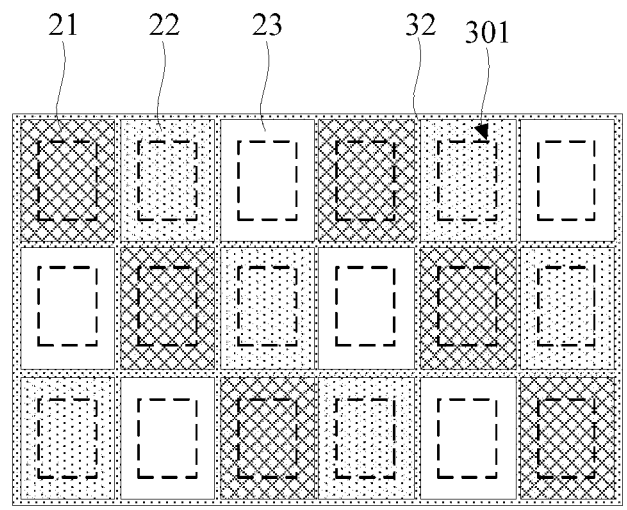
FIG. 18 is still another schematic diagram of a plurality of sub-pixels in a display region according to at least one embodiment of the present disclosure.

FIG. 18 is another schematic diagram of a plurality of sub-pixels in a display region according to at least one embodiment of the present disclosure. In some exemplary embodiments, as shown in FIG. 18, a plurality of sub-pixels of the display region are arranged according to a repeating unit including one first color sub-pixel 21, one second color sub-pixel 22, and one third color sub-pixel 23 sequentially arranged in the row direction, and the space between the sub-pixels of the same color in the row direction is approximately equal to one time of the width of the sub-pixels. The first color sub-pixel 21, the second color sub-pixel 22, and the third color sub-pixel 23 have substantially the same length in the row direction and substantially the same length in the column direction. In some examples, the first color sub-pixel 21 may be a blue sub-pixel, the second color sub-pixel 22 may be a red sub-pixel, and the third color sub-pixel 23 may be a green sub-pixel. However, this embodiment is not limited thereto.

In some exemplary embodiments, as shown in FIG. 18, the conductive protection structure 32 includes at least one conductive part located at an interval between light-emitting parts of light-emitting elements of at least two adjacent sub-pixels. The conductive protection structure 32 is formed with a plurality of meshes, wherein at least one mesh may be rectangular. At least one mesh surrounds a light-emitting part of a light-emitting element of a first color sub-pixel 21, or surrounds a light-emitting part of a light-emitting element of a second color sub-pixel 22, or surrounds a light-emitting part of a light-emitting element of a third color sub-pixel 23. A light-emitting part of the light-emitting element of any sub-pixel is a part located at the pixel define layer opening 301.

The structures of display regions in the exemplary embodiments are similar to corresponding structures described in the foregoing embodiments, which hence will not be repeated here. The structure (or method) shown in this embodiment may be combined with structures (or methods) shown in other embodiments as appropriate.

Figure 19:
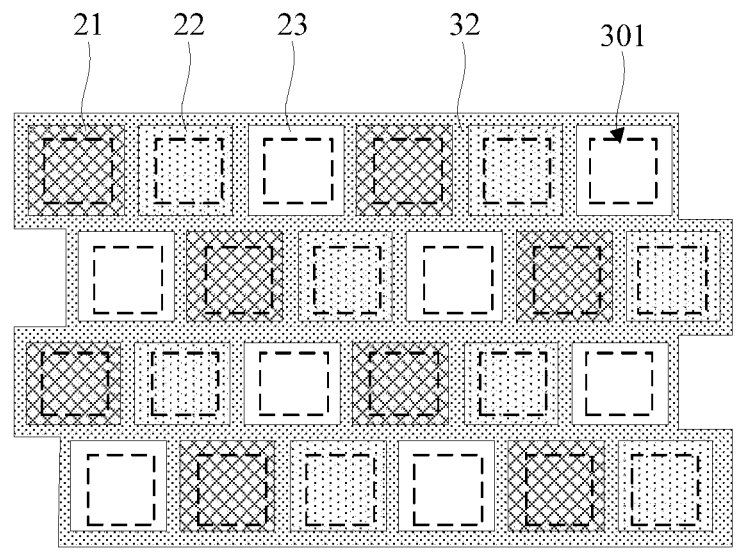
FIG. 19 is still another schematic diagram of a plurality of sub-pixels in a display region according to at least one embodiment of the present disclosure.

FIG. 19 is another schematic diagram of a plurality of sub-pixels in a display region according to at least one embodiment of the present disclosure. In some exemplary embodiments, as shown in FIG. 19, a plurality of sub-pixels of the display region are arranged according to a repeating unit including one first color sub-pixel 21, one second color sub-pixel 22, and one third color sub-pixel 23 sequentially arranged in the row direction, and the space between the sub-pixels of the same color in the row direction is approximately equal to 1.5 times of the width of the sub-pixels. The first color sub-pixel 21, the second color sub-pixel 22, and the third color sub-pixel 23 have substantially the same length in the row direction and substantially the same length in the column direction. In some examples, the first color sub-pixel 21 may be a red sub-pixel, the second color sub-pixel 22 may be a blue sub-pixel, and the third color sub-pixel 23 may be a green sub-pixel. However, this embodiment is not limited thereto.

In some exemplary embodiments, as shown in FIG. 19, the conductive protection structure 32 includes at least one conductive part located at an interval between light-emitting parts of light-emitting elements of at least two adjacent sub-pixels. The conductive protection structure 32 is formed with a plurality of meshes, wherein at least one mesh is rectangular or square. At least one mesh surrounds a light-emitting part of a light-emitting element of a first color sub-pixel 21, or surrounds a light-emitting part of a light-emitting element of a second color sub-pixel 22, or surrounds a light-emitting part of a light-emitting element of a third color sub-pixel 23. A light-emitting part of the light-emitting element of any sub-pixel is a part located at the pixel define layer opening 301.

The structures of display regions in the exemplary embodiments are similar to corresponding structures described in the foregoing embodiments, which hence will not be repeated here. The structure (or method) shown in this embodiment may be combined with structures (or methods) shown in other embodiments as appropriate.

Figure 20:
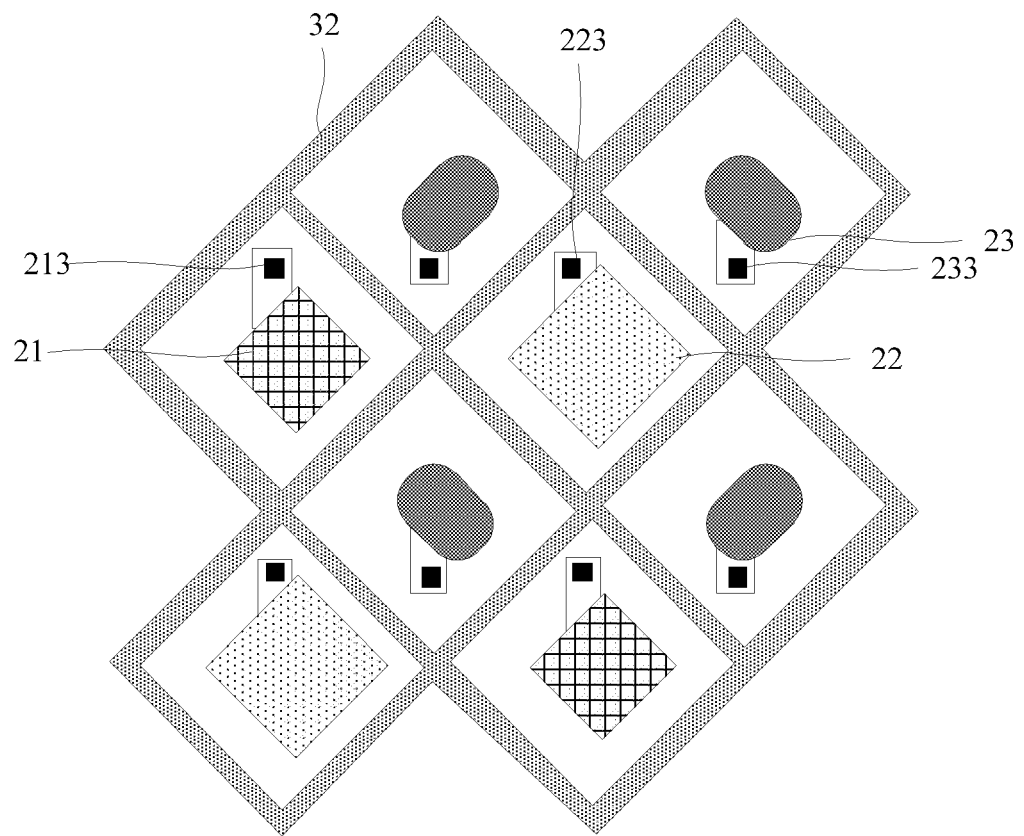
FIG. 20 is still another schematic diagram of a plurality of sub-pixels in a display region according to at least one embodiment of the present disclosure.

FIG. 20 is another schematic diagram of a plurality of sub-pixels in a display region according to at least one embodiment of the present disclosure. In some exemplary embodiments, as shown in FIG. 20, a plurality of sub-pixels of the display region may be arranged according to a diamond pattern. The first color sub-pixel 21 and the second color sub-pixel 22 have a diamond shape and the third color sub-pixel 23 is in the shape of a rounded rectangle. The first color sub-pixels 21 and the third color sub-pixels 23 are arranged in a straight line with a clockwise angle of 45 degrees with a horizontal line, and the second color sub-pixels 22 and the third color sub-pixels 23 are arranged in a straight line with a counterclockwise angle of 45 degrees with a horizontal line. In some examples, the first color sub-pixel 21 may be a red sub-pixel, the second color sub-pixel 22 may be a blue sub-pixel, and the third color sub-pixel 23 may be a green sub-pixel. However, this embodiment is not limited thereto.

In some exemplary embodiments, as shown in FIG. 20, the conductive protection structure 32 includes a plurality of conductive parts located at an interval between light-emitting parts of light-emitting elements of at least two adjacent sub-pixels. The conductive protection structure 32 is formed with a plurality of meshes, wherein at least one mesh is diamond-shaped. At least one mesh surrounds a light-emitting part of a light-emitting element of a first color sub-pixel 21, or surrounds a light-emitting part of a light-emitting element of a second color sub-pixel 22, or surrounds a light-emitting part of a light-emitting element of a third color sub-pixel 23. The conductive protection structure 32 is not overlapped with the projection of the anodes (e.g. the first anode 213, the second anode 223 and the third anode 233) of the plurality of light-emitting elements on the substrate. A light-emitting part of the light-emitting element of any sub-pixel is a part located at the pixel define layer opening.

The structures of display regions in the exemplary embodiments are similar to corresponding structures described in the foregoing embodiments, which hence will not be repeated here. The structure (or method) shown in this embodiment may be combined with structures (or methods) shown in other embodiments as appropriate.

At least one embodiment of the present disclosure further provides a method for preparing a display substrate, which includes providing a substrate including a display region; and forming a plurality of sub-pixels and a conductive protection structure on the substrate of the display region. Wherein, at least one sub-pixel of the plurality of sub-pixels includes a light-emitting element and a drive circuit for driving the light-emitting element to emit light, and the light-emitting element and the conductive protection structure are located on a side of the drive circuit away from the substrate. The conductive protection structure includes at least one conductive part located at an interval between light-emitting parts of light-emitting elements of at least two adjacent sub-pixels. The conductive protection structure is electrically connected with a signal terminal and configured to reduce carrier transmission between adjacent sub-pixels.

In some exemplary embodiments, the preparation method further includes forming a pixel define layer on a side of the drive circuit away from the substrate. The pixel define layer includes a plurality of sub-pixel definition parts, a pixel define layer opening is formed between adjacent sub-pixel definition parts, and the part of the light-emitting element located in the pixel define layer opening is used for light emission. Forming the conductive protection structure on the substrate of the display region includes forming a conductive protection structure on a side of a plurality of sub-pixel definition parts of the pixel define layer away from the substrate. At least part of the conductive protection structure is in direct contact with the plurality of sub-pixel definition parts, and a projection of the plurality of sub-pixel definition parts on the substrate covers a projection of the conductive protection structure on the substrate.

In some exemplary embodiments, forming the plurality of sub-pixels on the substrate of the display region includes forming a first electrode electrically connected to the drive circuit on a side of the drive circuit away from the substrate; forming an organic function layer on a side of the first electrode away from the substrate, at least a part of the first electrode is exposed by a pixel define layer opening, and the organic function layer contacts the first electrode through the pixel define layer opening; forming a second electrode contacting the organic function layer on a side of the organic function layer away from the substrate.

The preparation method of this embodiment may refer to the descriptions in the above-mentioned embodiments, and thus will not be repeated herein.

Figure 21:
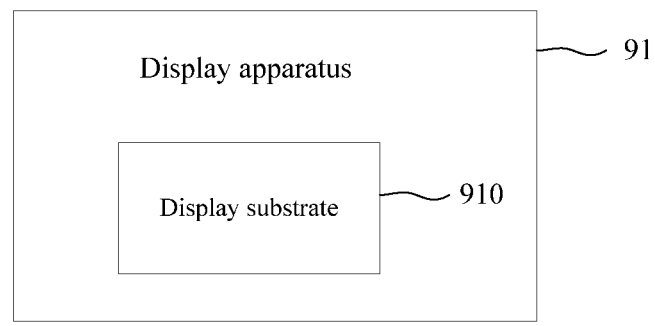
FIG. 21 is a schematic diagram of a display apparatus according to at least one embodiment of the present disclosure.

FIG. 21 is a schematic diagram of a display apparatus according to at least one embodiment of the present disclosure. As shown in FIG. 21, the embodiment provides a display apparatus 91, which includes a display substrate 910. The display substrate 910 is the display substrate provided in the above-mentioned embodiments. In some examples, the display substrate 910 may be an OLED display substrate. The display apparatus 91 may be any product or component with a display function, such as an OLED display apparatus, a mobile phone, a tablet computer, a television, a display, a laptop computer, a digital photo frame, a navigator, a vehicle-mounted display, a watch, and a wristband. However, this embodiment is not limited thereto.

The drawings of the present disclosure only involve the structures involved in the present disclosure, and the other structures may refer to conventional designs. The embodiments in the present disclosure, i.e., the features in the embodiments, may be combined with each other to obtain new embodiments if there is no conflict. Those of ordinary skill in the art should know that modifications or equivalent replacements may be made to the technical solutions of the present disclosure without departing from the spirit and scope of the technical solutions of the present disclosure, and shall all fall within the scope of the claims of the present application.

The invention claimed is:

1. A display substrate, comprising:
a substrate comprising a display region, wherein
the display region is provided with a plurality of sub-pixels and a conductive protection structure; at least one sub-pixel of the plurality of sub-pixels comprises: a light-emitting element and a drive circuit for driving the light-emitting element to emit light, the light-emitting element and the conductive protection structure are located on a side of the drive circuit away from the substrate;
the conductive protection structure comprises a plurality of conductive parts located at an interval between light-emitting parts of light-emitting elements of at least two adjacent sub-pixels; and the conductive protection structure is electrically connected with a signal terminal and configured to reduce carrier transmission between adjacent sub-pixels;
the display region is further provided with a pixel define layer and a post spacer; and
at least one of the plurality of conductive parts is in direct contact with the post spacer on a sub-pixel definition part of the pixel define layer, and the other of the plurality of conductive parts is in direct contact with the sub-pixel definition part.

2. The display substrate of claim 1, wherein the plurality of conductive parts are located at an interval between light-emitting parts of light-emitting elements of at least two adjacent sub-pixels of different colors.

3. The display substrate of claim 1, wherein the light-emitting element comprises an organic function layer comprising at least two organic layers, and the plurality of conductive parts are in contact with at least one of the organic layers.

4. The display substrate of claim 3, wherein the at least two organic layers comprise a first layer, wherein a projection of the first layer on the substrate is at least overlapped with a projection of the light-emitting parts of the light-emitting elements of two of the sub-pixels on the substrate, and the first layer is in contact with the plurality of conductive parts.

5. The display substrate of claim 4, wherein the first layer is a common layer between light-emitting elements of a plurality of sub-pixels.

6. The display substrate of claim 3, wherein a resistivity of the plurality of conductive parts are less than a resistivity of an organic layer contacting the plurality of conductive parts.

7. The display substrate of claim 3, wherein the pixel define layer is located on a side of the drive circuit away from the substrate, and the pixel define layer comprises a plurality of sub-pixel definition parts; wherein a pixel define layer opening is formed between adjacent sub-pixel definition parts, and the part of the light-emitting element located in the pixel define layer opening is used for light emission;
the conductive protection structure is provided on a side of the sub-pixel definition part away from the substrate, and a projection of the sub-pixel definition part on the substrate covers a projection of the conductive protection structure on the substrate.

8. The display substrate of claim 7, wherein the light-emitting element further comprises a first electrode and a second electrode;
the first electrode is disposed on a side of the drive circuit away from the substrate and electrically connected with the drive circuit, and the pixel define layer opening of the pixel define layer exposes at least part of the first electrode;
the organic function layer is disposed on a side of the first electrode away from the substrate, and is in contact with the first electrode through the pixel define layer opening; and
the second electrode is disposed on a side of the organic function layer away from the substrate, and is in contact with the organic function layer.

9. The display substrate of claim 7, wherein the organic function layer comprises an emitting layer and at least one of a hole injection layer, a hole transport layer, an electron block layer, an electron injection layer, an electron transport layer, and a hole block layer.

10. The display substrate of claim 9, wherein a projection of the plurality of conductive parts on the substrate is overlapped with a projection of emitting layers of two sub-pixels on the substrate and is not overlapped with a projection of the pixel define layer opening on the substrate.

11. The display substrate of claim 9, wherein emitting layers of two sub-pixels are overlapped, and a projection of the plurality of conductive parts on the substrate is overlapped with a projection of an overlapping part of the emitting layers of the two sub-pixels on the substrate.

12. The display substrate of claim 9, wherein at least one of the hole injection layer, the hole transport layer, the electron block layer, the electron injection layer, the electron transport layer, and the hole block layer is a common layer between light-emitting elements of a plurality of sub-pixels.

13. The display substrate of claim 8, wherein the conductive protection structure is electrically connected to the signal terminal through the second electrode.

14. The display substrate of claim 13, wherein a voltage value of the signal terminal is between a minimum voltage value of the second electrode and a maximum voltage value of the first electrode of the light-emitting element.

15. The display substrate of claim 1, wherein the conductive protection structure is a mesh structure formed by the plurality of conductive parts, and the mesh structure comprises at least one mesh, wherein the at least one mesh surrounds a light-emitting part of a light-emitting element of a sub-pixel; or surrounds a light-emitting part of a light-emitting element of a plurality of adjacent sub-pixels of the same color.

16. The display substrate of claim 15, wherein the plurality of sub-pixels in the display region are arranged according to a repeating unit comprising two first color sub-pixels, one second color sub-pixel and one third color sub-pixel in a first direction, wherein the two first color sub-pixels are arranged in a second direction perpendicular to the first direction, and a spacing of the same color sub-pixels in the first direction is approximately equal to 1 to 2 times of a width of the sub-pixels;
light-emitting parts of the light-emitting elements of two adjacent first color sub-pixels are surrounded by a mesh of the conductive protection structure, a light-emitting part of a light-emitting element of the second color sub-pixel is surrounded by a mesh of the conductive protection structure, and a light-emitting part of a light-emitting element of the third color sub-pixel is surrounded by a mesh of the conductive protection structure.

17. The display substrate of claim 1, wherein the signal terminal provides a constant potential.

18. The display substrate of claim 17, wherein the substrate further comprises: a peripheral region located at a periphery of the display region and is provided with at least one constant voltage signal line, and the conductive protection structure is electrically connected with the signal terminal through the at least one constant voltage signal line.

19. A display apparatus, comprising the display substrate according to claim 1.

20. A method for preparing a display substrate, comprising:
providing a substrate comprising a display region; and
forming a plurality of sub-pixels and a conductive protection structure on the substrate of the display region;
wherein at least one sub-pixel of the plurality of sub-pixels comprises a light-emitting element and a drive circuit for driving the light-emitting element to emit light, the light-emitting element and the conductive protection structure are located on a side of the drive circuit away from the substrate; the conductive protection structure comprises a plurality of conductive parts located at an interval between light-emitting parts of light-emitting elements of at least two adjacent sub-pixels; and the conductive protection structure is electrically connected with a signal terminal and configured to reduce carrier transmission between adjacent sub-pixels;
the display region is further provided with a pixel define layer and a post spacer; and
at least one of the plurality of conductive parts is in direct contact with the post spacer on a sub-pixel definition part of the pixel define layer, and the other of the plurality of conductive parts is in direct contact with the sub-pixel definition part.

* * * * *